United States Patent [19]
Sakai et al.

[11] Patent Number: 5,503,901
[45] Date of Patent: Apr. 2, 1996

[54] SURFACE TREATMENT METHOD AND SURFACE TREATMENT APPARATUS

[75] Inventors: Takayuki Sakai, Chofu; Hisataka Hayashi, Yokohama; Haruo Okano, Tokyo; Shigeyuki Takagi, Fujisawa; Yutaka Uchida, Kamakura, all of Japan

[73] Assignee: Kabushiki Kaisha Toshiba, Kanagawa, Japan

[21] Appl. No.: 267,799

[22] Filed: Jun. 29, 1994

[30] Foreign Application Priority Data

Jun. 30, 1993 [JP] Japan .................................. 5-162756
Jun. 27, 1994 [JP] Japan .................................. 6-144862

[51] Int. Cl.⁶ ...................................................... C03C 15/02
[52] U.S. Cl. ............................................ 428/161; 156/643.1
[58] Field of Search ..................................... 156/643, 646, 156/662, 663

[56] References Cited

U.S. PATENT DOCUMENTS 5,338,399  8/1994  Yanagida .................................. 156/662

FOREIGN PATENT DOCUMENTS 5-94974  4/1993  Japan .

OTHER PUBLICATIONS

"Examination of Selective Etching and Etching Damage with Mass–Selected Ion Beam", Sakai et al., 1993 Dry Process Symposium, VI-4, pp. 193–198, Tokyo, 1993.

"Polymerization for Highly Selective $SiO_2$ Plasma Etching", Samukawa, S., 1993 Dry Process Symposium, III-5, pp. 79–83, Tokyo, 1993.

*Primary Examiner*—W. Robinson Clark
*Attorney, Agent, or Firm*—Finnegan, Henderson, Farabow, Garrett & Dunner

[57] ABSTRACT

Etching selectivity is improved in a semiconductor process using a fluorocarbon gas. An energy incident to a substrate is controlled to have a value to cause transition from etching to deposition on a silicon nitride film, ions having $(CF_2)_n^+$ as a major component are guided onto the substrate to perform selective etching of a silicon oxide film against the silicon nitride film.

26 Claims, 19 Drawing Sheets

C4F8 DISSOCIATION
ELECTRON ENERGY
DEPENDENCY

SURFACE TREATMENT METHOD AND SURFACE TREATMENT APPARATUS

BACKGROUND OF THE INVENTION

1. Technology of the Invention

The present invention relates to a surface treatment method and surface treatment apparatus and more particularly, to a method and apparatus for selectively etching a silicon oxide film against a silicon nitride film.

2. Background Art

Conventionally, for etching a silicon oxide film, a reactive ion etching method has been employed because it enables a high accuracy pattern formation. In the reactive ion etching method, a substrate to be treated (e.g., a substrate on which a thin film to be etched is formed) is placed in a vacuum container. A pair of parallel plate electrodes is disposed in the container into which a reactive gas is introduced. Electric power of high frequency is applied to the electrodes so that gas discharging takes place to generate gas plasma, which is used for etching the substrate.

In addition to the reactive ion etching method, there are other methods including plasma etching method, ECR dry etching method, ion beam etching method and photo excited etching method. These methods carry out etching by chemically and physically react ions in an activated reactive gas onto the substrate in the vacuum container. Thus, in this respect, these methods are considered to be the same as the reactive ion etching method.

An example of these etching methods will now be described.

In performing selective etching to a silicon oxide film against a silicon nitride film, for example, the reactive ion etching is carried out by electric discharge in a mixture gas of fluorocarbon gas and $H_2$ or CO gas. Since various sorts of ion species generated in the plasma react with the substrate, the ion species contributing to the etching and the ion species contributing to the deposition co-exist on the substrate, which lowers the efficiency of the etching. In addition, the ion species acting to raise a selectivity of the silicon oxide film to the silicon nitride film have not been confirmed yet and other ion species may be present on the substrate, which deteriorates the selectivity. However, as the integration density of a semiconductor integrated circuit is increased, when performing etching to the silicon oxide film on the silicon nitride film to form contact holes or the like, a higher selectivity against the underlying silicon nitride is required. Suppose now a case where contact holes such as storage node contacts or bit line contacts in a DRAM are formed by using a self aligned contact hole (SAC) etching process as shown in FIG. 20. On the surface and the side walls of a gate electrode 33 of a polycrystalline silicon film which is formed on a silicon substrate 31 via a gate insulating film 32, a silicon nitride film 34 is formed. Above the silicon nitride film 34, a silicon oxide film 35 having a thickness of about 700 μm is formed as an interlayer insulating film. Thereafter, In forming a contact hole H in the gate electrode 33 in a self alignment manner, a resist pattern R having a somewhat larger size is formed and etching is performed by using the silicon nitride film 34 as an etching stop layer. At this time, for the purpose of reducing a capacitance between wiring, the thickness of the interlayer insulating film cannot be made too small and thus must be about 400 nm. The gate electrode is formed in a multi-layered structure with the metallic film and is required to have a thickness of about 300 nm. The thickness of the silicon nitride film 34 is required to be as small as possible since wiring material is embedded into the contact hole after the SAC etching step. In this example, the thickness of the silicon nitride film 34 is about 50 nm.

For the SAC etching, the thickest part of the silicon oxide film in the opening has a thickness of 700 nm. Since the etch rate of the silicon oxide film is unequally distributed on the wafer surface and the thickness of the interlayer insulating film is unequally distributed on the wafer surface, over-etching is necessary by about 30%. In other words, an etching time of about 910 nm (=700 nm ×1.3) is necessary.

Thus, the time during which the silicon nitride film 34 is subjected to the reactive ion etching (RIE) corresponds to the etching time of the silicon oxide film of 510 nm (=910 nm −400 nm).

At this time, the silicon nitride film must exist at least half of the thickness thereof, which is 25 nm.

Accordingly, the etching selectivity of the silicon oxide film to the silicon nitride film is required to be 20.5 (=$^{510}/_{25}$).

Thus, by determining the conditions for satisfying the requirements that the etching selectivity of the silicon oxide film to the silicon nitride film is about 20, the cell size can be remarkably reduced. However, it is difficult to cope with such requirements by conventional etching methods. For the purpose of improving the selectivity, variety of studies have been conducted.

In summary, conventional selective etching which use a fluorocarbon gas for selective etching of the silicon oxide film against the silicon nitride film, have a problem that among various sorts of ion species contributing to the surface reaction, it is not confirmed which ion species actually contributes to the surface reaction. As a result, these methods provides low etching efficiency, insufficient selectivity, and therefore impractical.

SUMMARY OF THE INVENTION

In view of the above circumstances, it is an object of the present invention to provide method and apparatus which can improve an etching selectivity in a semiconductor process using a fluorocarbon gas.

In accordance with one aspect of the present invention, there are provided a step of supplying a gas containing a fluorocarbon gas, a step of dissociating a fluorocarbon gas into ions, and a step of selectively etching a silicon oxide film against a silicon nitride film by controlling ions having $(CF_2)_n^+$ (n=1, 2, 3, . . . ) as a major component among the ions obtained by the ion dissociation step so as to be guided onto a semiconductor substrate. As a gas, the fluorocarbon gas may contain Ar, Ne, He, Kr or Xe and so on. The term "major component" refers to the fact that $(CF_2)_n^+$ is a major component in the fluorocarbon ions.

Preferably, an energy incident to the semiconductor substrate is controlled such that a reaction induced on the silicon nitride film by ions including $(CF_2)_n^+$ as the major component takes an energy value of causing transition from etching to deposition, so as to lead the ions including $(CF_2)_n^+$ as the major component onto the semiconductor substrate. As a result, selective etching is performed to the silicon oxide film against the silicon nitride film.

More particularly, the energy incident to the semiconductor substrate is controlled such that a reaction induced on the silicon nitride film by ions including $(CF_2)_n^+$ as the major component takes an energy value of causing transition from etching to deposition. For example, in the case of using $CF_2^+$ ions, the incident energy to the substrate is set to be 200 eV. In the case of using $C_2F_4^+$ ions, the incident energy to the substrate is set to be 150 eV. In the case of using such ions having a larger 'n' as $C_3F_6^+$ ions or $C_4F_8^+$ ions, by reducing the energy, etching can be performed with high selectivity.

Preferably, the etching step includes a step of controlling the energy incident to the semiconductor substrate such as to satisfy the following relationships where x (=$CF_3^+/(C_2F_4^+ CF_3^+)$) is ratio of a $CF_3^+$ concentration to a $(C_2F_4^+ + CF_3^+)$ concentration in the ions obtained by the ion dissociation and E is an incident energy directed to the semiconductor substrate, whereby the ions are guided onto the semiconductor substrate and selective etching is performed to the silicon oxide film against the silicon nitride film.

152 eV < E ≦ 223 eV, and x < −0,744 + 19768.7/(214.8E − 21240)

where x : $CF_3^+/(C_2F_4^+ + CF_3^+)$

E: ion incident energy substrate.

The term "ion concentration" is defined as the number of ions per unit volume.

Further, it is preferable that the etching step includes a step of selectively etching a silicon oxide film against a silicon nitride film by controlling the ions obtained by the ion dissociation such that energy incident to the semiconductor substrate is 152 eV or less, and by guiding the ions onto the semiconductor substrate.

Further it is preferable that the etching step is a step of controlling an ion beam such as to satisfy the above relationships and guiding the ion beam onto the semiconductor substrate.

Further, it is preferable that the gas supply step is a step of supplying a c-$C_4F_8$ gas as the fluorocarbon gas, wherein the ion dissociation is carried out by generating a plasma from the c-$C_4F_8$. In this case, the c-$C_4F_8$ gas is one of fluorocarbon gases having 4-ring structure (which applies to the following cases).

Further, it is preferable that the gas supply step includes a step of supplying a c-$C_4F_8$ gas as the fluorocarbon gas under a reduced pressure into an air-tight reaction container which accommodates the semiconductor substrate, the etching step is a step of selectively etching a silicon oxide film against a silicon nitride film by changing a c-$C_4F_8$ gas into plasma to dissociate ions, controlling the dissociated ions such that a ratio of $CF_3^+$ ion concentration to a total concentration of $(CF_2)_n^+$ in the ions to be guided onto the semiconductor substrate becomes 8% or less, and by guiding the controlled ions onto the semiconductor substrate.

Further, it is preferable that the gas supply step includes a step of supplying a c-$C_4F_8$ gas and at least one of Kr and Xe gases under a reduced pressure into an air-tight reaction container for accommodating the semiconductor substrate, and the ion dissociation is carried out by generating a plasma from a mixture gas of the c-$C_4F_8$ gas and at least one of the Kr and Xe gases.

Preferably, the gas supply step includes a step of supplying a c-$C_4F_8$ gas under a reduced pressure into an air-tight reaction container which accommodates the semiconductor substrate, and the ion dissociation is carried out by exciting the gas by using an electron beam which is controlled so that an electron energy is less than 33 eV so as to generate plasma.

Further, it is preferable that the gas supply step includes a step of supplying a c-$C_4F_8$ gas under a reduced pressure into an air-tight reaction container for accommodating the semiconductor substrate, and the ion dissociation is achieved by generating a plasma from the gas with use of light having wavelengths of between 70.9 nm and 102.5 nm.

Preferably, the gas supply step includes a step of supplying a c-$C_4F_8$ gas under a reduced pressure into an air-tight reaction container which accommodates the semiconductor substrate, and the ion dissociation is carried out by changing the gas into plasma, and by controlling the following mathematical formula in which collision coefficient N represents collision between c-$C_4F_8$ molecules present in the plasma and electrons present in the plasma, $n_e$ represents an electron density in the plasma, τ represents a stay time of the c-$C_4F_8$ molecules in the plasma within the air-tight reaction container, $N = n_e \times \tau \leq 7.2E8$ $\tau = P \times V \times Q^{-1}$ P: c-$C_4F_8$ partial pressure V: volume of the reaction container Q: c-$C_4F_8$ flow rate.

Preferably, the etching step includes a step of controlling such that an incident energy of ions to the semiconductor substrate generated by changing the gas into plasma becomes 500 eV or less.

Further, it is preferable that the ions are generated by generating magnetron plasma while controlling such that the stay time τ = P x V/Q of the c-$C_4F_8$ molecules present in the plasma becomes 24 msec or less.

Further, it is preferable that the ions are generated by generating plasma by using a parallel plate plasma generation apparatus while controlling such that the stay time τ = P x V/Q of the c-$C_4F_8$ molecules present in the plasma becomes 720 msec or less.

Preferably, the ion dissociation is achieved by exciting the gas by a controlled electron beam while controlling such that the stay time τ = P x V/Q of the c-$C_4F_8$ molecules present in plasma becomes 7.2 msec or less.

It is preferable that the ion dissociation is achieved by generating plasma by using a microwave-excited plasma generation apparatus while controlling such that the stay time τ = P x V/Q of the c-$C_4F_8$ molecules present in the plasma becomes 7.2 msec or less.

Preferably, the ion dissociation is achieved by generating plasma by using an inductive coupled plasma generation apparatus while controlling such that the stay time τ = P x V/Q of the c-$C_4F_8$ molecules present in the plasma becomes 0.72 msec or less.

Preferably, the ion dissociation is achieved by generating plasma by using a helicon-excited plasma generation apparatus while controlling such that the stay time τ = P x V/Q of the c-$C_4F_8$ molecules present in the plasma becomes 0.072 msec or less.

It is preferable that the gas supply step includes a step of supplying a c-$C_4F_8$ gas under a reduced pressure into an air-tight reaction container which accommodates the semiconductor substrate, and the ion dissociation is achieved by changing the gas into plasma by using an high-frequency pulse signal modulated with pulses of several milliseconds to several hundreds of milliseconds.

Preferably, the plasma of the gas is generated by a magnetron excited plasma generation apparatus.

Preferably, the gas supply step includes a step of supplying a c-$C_4F_8$ gas under a reduced pressure into an air-tight reaction container which accommodates the semiconductor substrate, and the ion dissociation is achieved by changing the gas into plasma by using an electron beam modulated with pulses of several milliseconds to several tens of milliseconds.

In accordance with second aspect of the present invention, there is provided a surface treatment apparatus which comprises gas supply means for supplying a fluorocarbon gas onto a semiconductor substrate installed within a reaction container, and ion species control means for generating a plasma from the fluorocarbon gas and controllably guiding ones $(CF_2)_n^+$ of obtained ions as a major component onto the semiconductor substrate.

It is preferable that the gas supply means includes means for controlling the gas flow rate Q or the c-$C_4F_8$ partial pressure to cause a collision coefficient N indicative of collision between c-$C_4F_8$ molecules present in the plasma and electrons present in the plasma to be 7.2E8 or less to thereby control the c-$C_4F_8$ flow rate Q or the c-$C_4F_8$ partial pressure, where N : $n_3$ x τ

τ : stay time in the reaction container (= P x V x $Q^{-1}$)

$n_e$: electron density in the plasma

P: c-$C_4F_8$ partial pressure

V: volume of the reaction container

Q: c-$C_4F_8$ flow rate.

Further, it is preferable that the ion species control means includes means for generating a plasma from the gas with use of an electron beam modulated with pulses of several milliseconds to several hundreds of milliseconds.

As has been described above, when the ion dissociation is carried out by generating the plasma from the gas, in general, ion incident energy (E) has a certain distribution. In more detail, the energy has such a distribution width ΔE as given below.

ΔE = (8/3ωd) {$eV_{th}$)$^{1.5}$/(2M)$^{1/2}$} where ω: frequency (rad/sec)= 2πf f: frequency of application electric field d: sheath width (m)

M: ion mass $V_{th}$: $V_{dc}$ (cathode drop voltage) + $V_p$ (plasma potential)

e: elementary electric charge.

Energy distribution f(E) is given as follows.

f(E)= (4$N_0$/ωΔE) [1- {2(E - $eV_{th}$)/ΔE}$^2$]$^{0.5}$ where $N_0$: the number of particles (m$^{-3}$) (the number of ions per 1 m$^3$)

In the invention described above, the ion incident energy refers to an average energy value of the energy distribution.

According to the present invention, the silicon oxide film refers to an oxide film containing impurities such as boron, phosphorus, arsenic and so on. The silicon oxide film may be made of, for example, boron-added silicate glass (BPSG) or arsenic-added silicate glass (ASSG).

In the present invention, when $(CF_2)_n^+$ among chemical species generated in the plasma of the fluorocarbon gas are preferentially energy-controlled and then sent onto the substrate, the etching of the silicon oxide film against the silicon nitride film can be carried out with an excellent selectivity. Thus, when it is desired to perform etching over the silicon oxide film deposited on the silicon nitride film for example, the etching can be stopped on the surface of the silicon nitride film.

As a result of various experiments, the inventors of the present application has found that when $(CF_2)_n^+$ ions are used in the fluorocarbon gas, the selectivity can be improved and that the energy value at which transition takes place on the silicon nitride film from etching to deposition is determined by the 'n'.

This phenomenon is considered to occur through the following mechanism. That is, as the incident energy of $(CF_2)n^+$ ions directed to the substrate surface is reduced, the etching product varies, thus reducing an etch rate. When the incident energy drops to a certain level or less, C remains on the substrate surface to form a substance containing Si-C couplings. Since this substance and the fluorocarbon polymer film formed on the substance function as protective films, when the ions are continuously directed to the substrate surface at that level, the substrate surface is fully covered with these substances, which results in the etching is stopped halfway and deposition takes place. AS the energy is further decreased, probability of C residual is increased. When the energy drops to a certain level or less, the etching is stopped and only deposition takes place. The transition energy from etching to deposition on the silicon oxide film is different from that on the silicon nitride film. By determining the energy value while utilizing the above fact, selective etching can be realized. The present invention is based on the above viewpoint.

In the course of shifting from etching to deposition, there exists an energy zone where the etching is stopped halfway and instead deposition starts to take place, which results in that the incident energy value to be controlled can have an allowance depending on the tradeoff of the thickness of the silicon nitride film.

It has been further found that, for the purpose of actually realizing this selective etching, when the collision frequency between ions and electrons is controlled at the time of introducing the ions obtained by the plasma dissociation of the fluorocarbon gas onto the substrate, a high selectivity can be obtained.

Thus, for the purpose of an etching selectivity of 20 which is considered to be necessary for fabricating a device, $CF^+$, $CF_2^+$ and $CF_3^+$ ions are separately generated by using a mass spectrometer, etching is carried out and etched amounts are measured to detect a difference between etching characteristics based on different ion species. When attention is directed to $C_2F_4^+$, $CF_2^+$ and $CF_3^+$ ions present in the $C_4F_8$ gas plasma, respective incident ion energies capable of producing the practical selectivity of 20 necessary for the actual device fabrication are 223 eV, 215 eV and 152 eV respectively, as mentioned above (refer to FIG. 5).

In the range of 152 eV to 223 eV, as seen from FIG. 5, it is substantially only $C_2F_4^+$ and $CF_3^+$ that the etching of the silicon nitride film becomes large enough to cause problems. Other ions can be neglected. Accordingly, it is found that, in this range, only the mixture ratio of these ions should be selected so that the etching selectivity has 20 or more. To this end, an upper limit of a mixture ratio x to the incident ion energy is calculated based on the etch rate obtained in FIG. 5, and a curve Q indicative of the upper limit is obtained (refer to FIG. 6). A zone below the curve Q is called a safety zone for the incident energy zone of 152 eV to 223 eV, i.e., where the etching selectivity of 20 or more can be assured. As a result of our experiments, it has been found that, when a relationship between the mixture percentage of $CF_3^+$ as a cause of reducing the selectivity and the incident energy to the substrate is found and when 'x' denotes a ratio (=$CF_3^+/(C_2F_4^+ + CF_3^+)$) of $CF_3^+$ to $(C_2F_4^+ + CF_3^+)$ in the ions obtained by the dissociation of the fluorocarbon gas, an excellent selectivity can be obtained by controlling the incident energy E directed to the semiconductor substrate and the ratio 'x' to satisfy the following relationships.

152 eV < E ≦ 223 eV x < −0.744+ 19768.7/(214.8E − 21240)

where x : $CF_3^+/(C_2F_4^+ + CF_3^+)$

E: incident energy of ions

Further, it has been found from the experiments that, by controlling and introducing onto the substrate the $C_2F_4^+$, $CF_2^+$, and $CF_3^+$ ions obtained by the dissociation of the fluorocarbon gas so that the energy directed to the semiconductor substrate become 152 eV or less, the etch rate is reduced but an excellent selectivity can be obtained because the etch rate of the silicon nitride film is small.

It has also been found from our experiments that, even in the case of using plasma dissociation, when the ions introduced onto the substrate are controlled so that a ratio of a $CF_3^+$ ion concentration to the total $(CF_2)_n^+$ ion concentration is 8% or less, an excellent selectivity can be obtained.

In addition, it has been found from our experiments that when a $c$-$C_4F_8$ gas and at least one of Kr and Xe gases are introduced under a reduced pressure into an air-tight reaction chamber for accommodating a semiconductor substrate and the gas is changed to a plasma, an excellent selectivity can be obtained.

This is considered to due to the fact that, since the Kr or Xe gas plasma has a low electron temperature, when the gas is mixed with $c$-$C_4F_8$ gas, the further dissociation of $C_2F_4^+$ ions generated by the dissociation of the $c$-$C_4F_8$ gas can be suppressed and $C_2F_4^+$ ions to $CF_3^+$ ions in the plasma can be selectively generated.

Also it has been found from our experiments that the $c$-$C_4F_8$ gas is introduced, excited and ionized with a controlled electron beam to cause the electron energy to be less than 33 eV, an excellent selectivity can be obtained.

Our experiments have showed that when the $c$-$C_4F_8$ gas is introduced and changed to a plasma by using light having wavelengths of 70.9 nm to 102.5 nm, an excellent selectivity can be obtained. This is considered to be due to the fact that, in this wavelength zone, since $C_2F_4^+$ ions can be selectively generated to $CF_3^+$ ions, an excellent selectivity can be obtained.

Further, our experiments have showed that when a $c$-$C_4F_8$ gas is introduced and changed to a plasma and when an electron density in the plasma and a stay time $r$ of $c$-$C_4F_8$ molecules in the plasma within the air-tight reaction container are controlled so that a collision coefficient N between the $c$-$C_4F_8$ molecules present in the plasma and electrons present in the plasma becomes $7.2 \times 10^8$ or less, an excellent selectivity can be obtained, where N is expressed by $n_e \times \tau$ $(= P \times V \times Q^{-1})$, $n_e$ denotes an electron density in the plasma, P denotes process pressure, V denotes the volume of the reaction container, and Q denotes a $c$-$C_4F_8$ flow rate.

Preferably, the incident energy of ions in the gas plasma directed to the semiconductor substrate is controlled to be 500 eV or less. When the incident energy exceeds 500 eV, the damage of the substrate surface becomes remarkable.

Further, it is preferable that the plasma is generated within a magnetron plasma generation apparatus.

In this case, it has been found that, when the stay time $\tau$ $=P \times V/Q$ of the $c$-$C_4F_8$ molecules present in the plasma is controlled to be 24 sec or less, an excellent sensitivity can be obtained.

It has also been found that, in the case of generating a plasma by using a parallel plate plasma generation apparatus, when the stay time $\tau = P \times V/Q$ of the $c$-$C_4F_8$ molecules present in the plasma is controlled to be 720 msec or less, an excellent sensitivity can be obtained.

Our experiments have also showed that, in the case of exciting the gas by using a controlled electron beam, when the stay time $\tau = P \times V/Q$ of the $c$-$C_4F_8$ molecules present in the plasma is controlled to be 7.2 msec or less, an excellent sensitivity can be obtained.

It has also been found from our experimental results that, in the case of generating a plasma by using a μ-wave excited plasma generation apparatus, when the stay time $\tau = P \times V/Q$ of the $c$-$C_4F_8$ molecules present in the plasma is controlled to be 7.2 msec or less, an excellent sensitivity can be obtained.

It has further been found from our experimental results that, in the case of generating a plasma by using an inductive coupled plasma generation apparatus, when the stay time $\tau$ $= P \times V/Q$ of the $c$-$C_4F_8$ molecules present in the plasma is controlled to be 0.72 msec or less, an excellent sensitivity can be obtained.

It has also been found from our experimental results that, in the case of generating a plasma by using a helicon-excited plasma generation apparatus, when the stay time $\tau = P \times V/Q$ of the $c$-$C_4F_8$ molecules present in the plasma is controlled to be 0.072 msec or less, an excellent sensitivity can be obtained.

It has furthermore been found from our experimental results that, when the $c$-$C_4F_8$ gas is introduced and changed to a plasma by using a high frequency signal modulated with pulses of several milliseconds to several tens of milliseconds, an excellent sensitivity can be obtained.

Preferably, the plasma of the gas is a magnetron plasma.

It has been found that, preferably when the $c$-$C_4F_8$ gas is introduced into an air-tight reaction container for accommodating a semiconductor substrate under a reduced pressure and Then changed to a plasma by using an electron beam modulated with pulses of several milliseconds to several tens of milliseconds, an excellent sensitivity is obtained.

Further, the second aspect of the present invention comprises gas supply means for supplying a fluorocarbon gas onto a semiconductor substrate installed within a reaction container, and ion species control means for generating a plasma from the fluorocarbon gas by means of dissociation of the fluorocarbon gas and controllably guiding ones $(CF_2)_n^+$ of obtained ions as a major component onto the semiconductor substrate.

From the experiment result, it has been found preferable that the gas supply means includes means for controlling the $c$-$C_4F_8$ gas flow rate Q and the $c$-$C_4F_8$ partial pressure P so that the collision coefficient N between the $c$-$C_4F_8$ molecules present in the plasma and electrons present in the plasma, the electron density $n_e$ and the stay time $r$ of the $c$-$C_4F_8$ molecules in the plasma within the air-tight reaction container satisfy the following relationship.

$$N = n_e \times \tau \leq 7.2E8$$

where $\tau = P$ : $c$-$C_4F_8$ partial pressure

V: volume of the reaction container

Q: $c$-$C_4F_8$ gas flow rate

Further, preferably, when the ion species control means includes means for generating a plasma from the gas by using an electron beam modulated with pulses of several milliseconds to several tens of milliseconds, a selectivity can be improved to a large extent.

DESCRIPTION OF THE EMBODIMENTS

The embodiments of present invention will be described with reference to the accompanying drawings.

Figure 1:
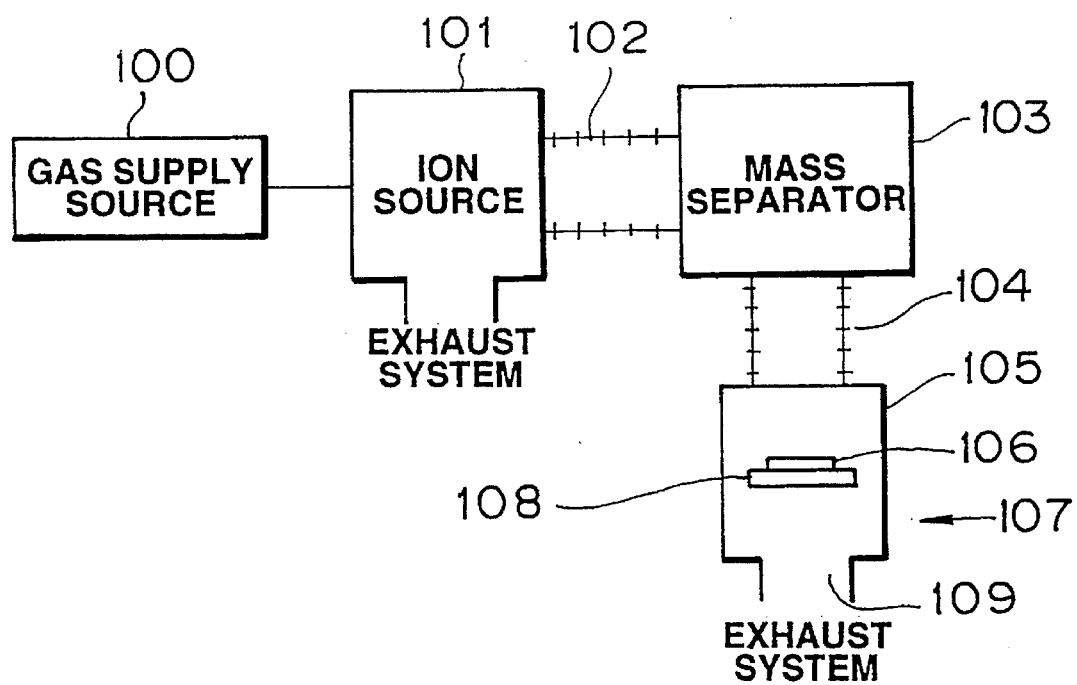
FIG. 1 is a schematic arrangement of a surface treatment apparatus used in a method in accordance with an embodiment of the present invention.

FIG. 1 schematically shows an arrangement of a surface treatment apparatus used in an embodiment of the present invention.

The apparatus comprises a gas supply source 100, an ion source 101 supplied with a $C_4F_8$ gas as a source gas from the gas supply source 100 for generating an ion beam 102 by dissociation, a mass separator 103 for separating the ion beam 102 for each chemical species, a deceleration system 104 for controlling deceleration of the separated ion beam, and a surface treatment chamber 107 including a vacuum container 105 for performing etching or thin-film depositing operation over a wafer 106 placed within the vacuum container 105. In the illustrated example, the wafer is placed on a susceptor 108 equipped with a temperature control mechanism capable of controlling a temperature within a range between −50° and 800° C. The vacuum container 105 is connected with a gas exhausting system 109.

Description will next be made as to the surface treatment method used in the aforementioned apparatus.

Figure 2A:
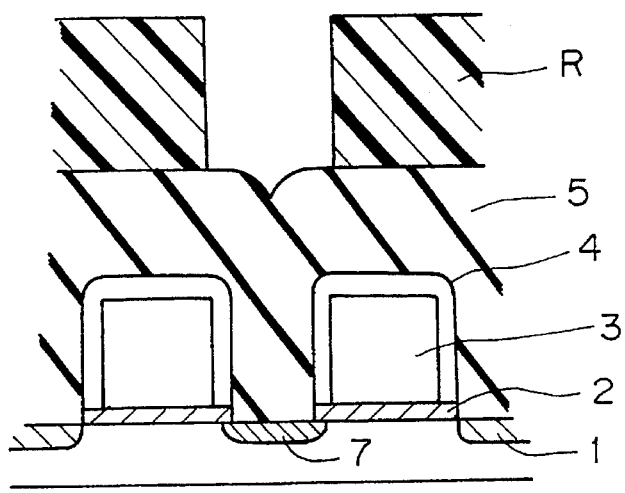
FIGS. 2(a) to 2(c) show surface treatment steps of the embodiment of the present invention.

In the illustrated example, the mass separator is controlled so that the radiated ion species becomes $(CF_2)^+$. First of all, description will be directed to a step of forming a bit line contact in a DRAM by using an SAC (self aligned contact hole) etching process as shown in FIG. 2(a). A gate electrode 3 made of a polycrystalline silicon film is formed on a surface of a silicon substrate 1 via a gate insulating film 2, the gate electrode 3 is coated on the surface and side walls with a silicon nitride film 4 of 50 nm thick. Thereafter, a diffusing operation is performed by using the gate electrode 3 as a mask to form a diffusion layer 7 as a source/drain region and to form a MOS FET as a switching transistor. Above the MOS FET, a silicon oxide film 5 having a thickness of about 700 μm is formed as an interlayer insulating film to which an etching is performed by using a resist pattern R as a mask to form a bit line contact hole H in a self alignment manner. In this case, the resist pattern R is formed to be somewhat large and the etching is carried out by using the silicon nitride film 4 as an etching stop layer.

The substrate thus sequentially formed is used as a wafer to which etching is performed by using the resist pattern R as a mask at room temperature and by using $(CF_2)^+$ ions irradiated at an incident energy of 200 eV.

Figure 2B:
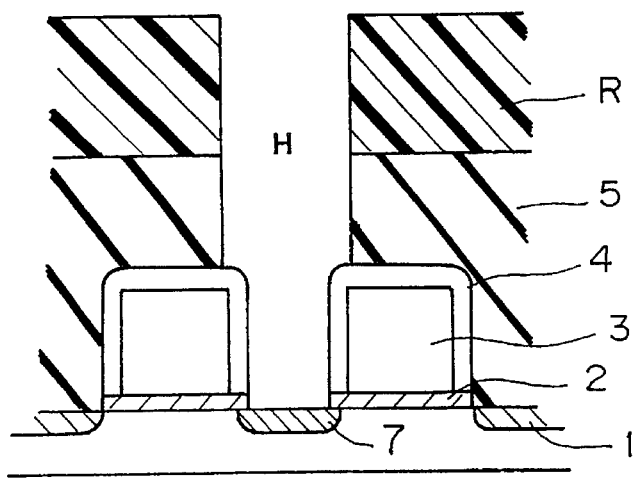
Figure 2C:
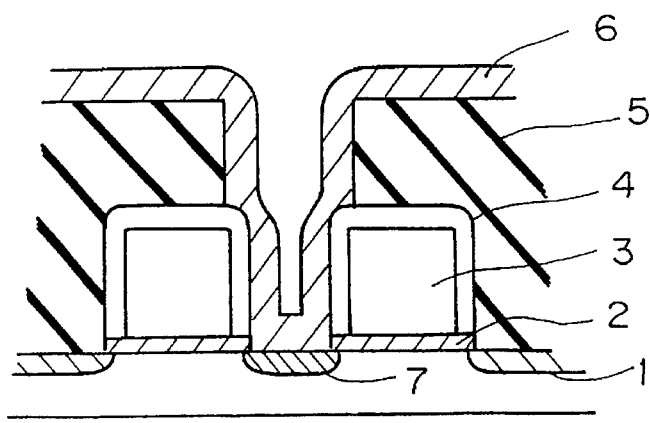

As a result, as shown in FIG. 2(b), patterning is performed to the silicon oxide film 3 with an extremely high selectivity and the bit line contact hole H is formed in a self alignment manner with respect to the gate electrode 5.

Thereafter, the polycrystalline silicon film is deposited by a CVD method or the like so as to come into contact with the diffusion layer (source/drain region) 7 within the contact hole and then subjected to a patterning operation to form a bit line 6.

One part of the diffusion layer 7 is connected to the bit line while on another part thereof (not shown) a capacitor is formed through a storage node electrode, thus forming a cell. In accordance with the method of the present invention, since the bit line contact can be formed in a self alignment manner, the cell size can be remarkably reduced and thus a DRAM having small size and high reliability is fabricated.

Figure 3:
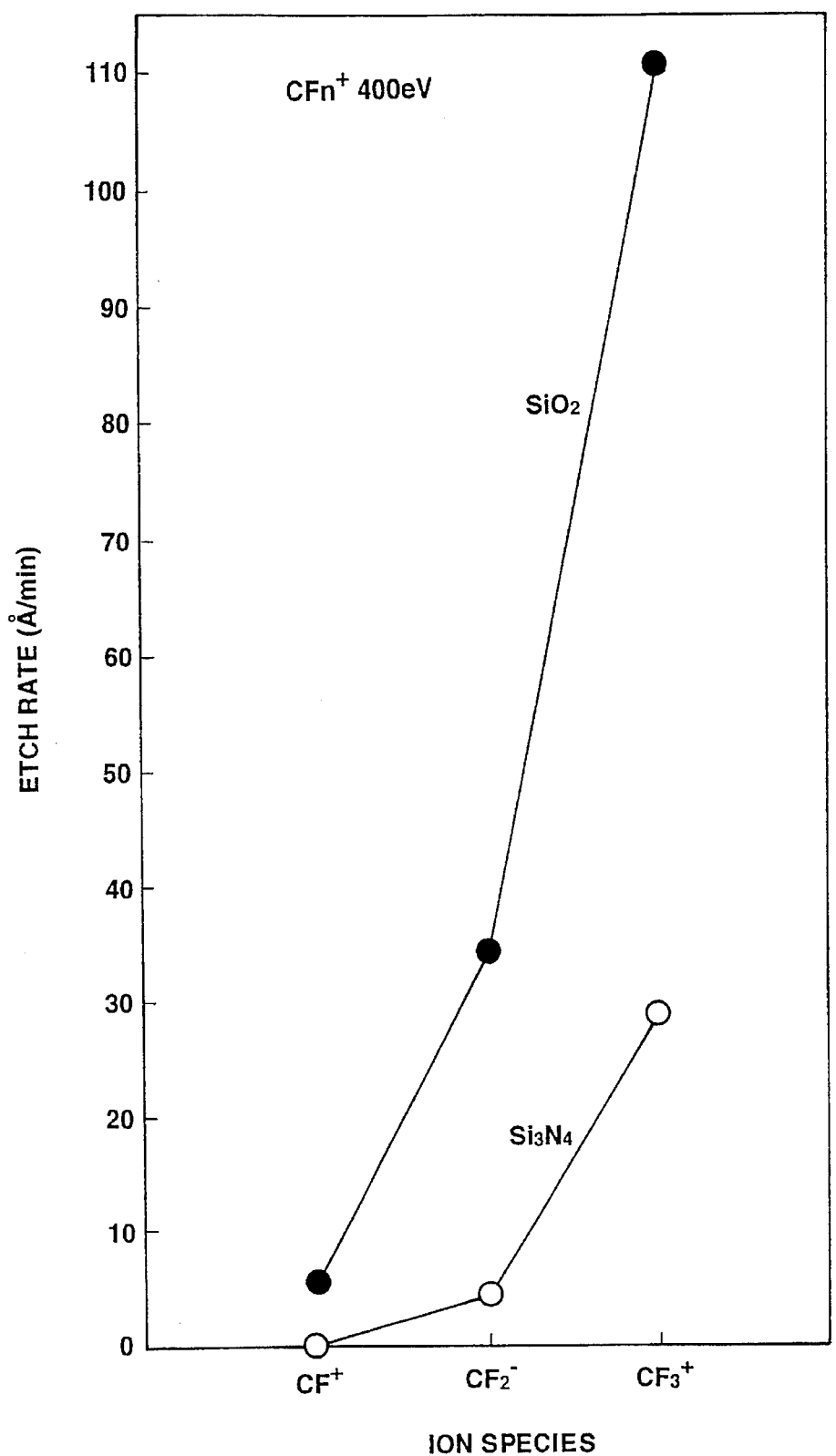
FIG. 3 shows a relationship between ion species and etch rate.

Next, in order to detect a difference between etching characteristics for different ion species, $CF^+$, $CF_2^+$ and $CF_3^+$ are separately generated by using a mass separator and then etchings are carried out to measure etching amounts. As samples, substrates each having a silicon oxide film and a silicon nitride film formed thereon are prepared and then subjected to etchings with a radiation energy of 400 eV and a substrate temperature being at room temperature. The result is given in FIG. 3. As seen from the result, the etch rates of $SiO_2$ and $Si_3N_4$ are increased in the order of $CF^+$, $CF_2^+$ and $CF_3^+$. In terms of $SiO_2/Si_3N_4$ etch rate ratio (selectivity), $CF_3^+$ is the worst and $CF^+$ is the best. However since $CF^+$ has a small etch rate, etching to $SiO_2$ stops on half way. Accordingly, among these 3 sorts of ions, $CF_2^+$ is most preferable.

Figure 4:
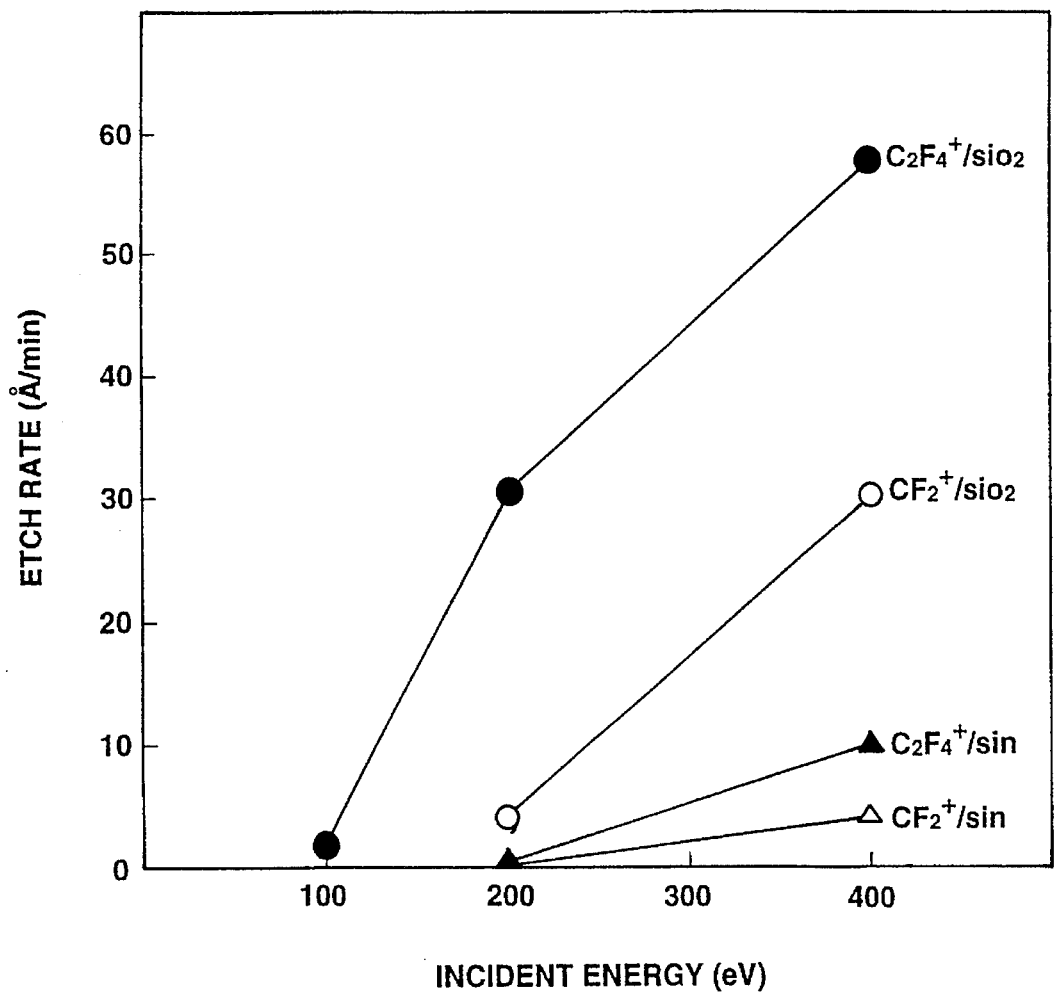
FIG. 4 shows a relationship between incident energy and etch rate.

Next, substrates with a silicon oxide film and a silicon nitride film are subjected to radiations of $CF_2$ and $C_2F_4^+$ ions with varied incident energies, which result is given in FIG. 4. At an incident energy of 400 eV, the etch rate of $C_2F_4^+$ is twice of that of $CF_2^+$ on the silicon oxide film and silicon nitride film, and their selectivity is the same. When the incident energy is reduced down to 200 eV, the $CF_2^+$ etching is stopped halfway on the $SiO_2$ film and on the $Si_3N_4$ film. In the case of $C_2F_4^+$, the etching is stopped on the $Si_3N_4$ film but the etching proceeded without being stopped on the $SiO_2$ film, which results in a high selectivity of higher than 50.

Further, ions $(CF_2)_n^+$ and $CF_3^+$ which are generated by dissociation of c-$C_4F_8$ are radiated on subjects each having a silicon oxide film and a silicon nitride film formed thereon with varied incident energies. Their etching characteristics are measured and the results are given in FIG. 5. At an incident energy of 300 eV, in the case of $CF_2^+$, etching takes place on the silicon oxide film but etching is saturated on the silicon nitride film due to the deposition of fluorocarbon polymeric film thereon. At 200 eV, the etching of the silicon oxide film by $CF_2^+$ is also saturated, but the etching of the silicon oxide film by $C_2F_4^+$ proceeds while the etching on the silicon nitride film is saturated. It is appreciated from these results that selective etching of the silicon oxide film against the silicon nitride film with a high selectivity can be realized at 300 eV for $CF_2^+$ and at 200 eV for $C_2F_4^+$. In addition, even in the case of $C_3F_6^+$ and $C_4F_8^+$, when an incident energy is set at 150 eV and 75 eV respectively, the selective etching of the silicon oxide film against the silicon nitride film can be carried out at a high selectivity. In a process of transition from etching to deposition, since there exists an energy zone of a certain width within which the etching is stopped halfway and the deposition starts, the control range of the incident energy value can have an allowance depending on the tradeoff with the thickness of the silicon nitride film.

It is expected from the above result that, even in the case of $(CF_2)_n^+$ (n>4), by controlling the energy, the selective etching of the silicon oxide film against the silicon nitride film can be attained. Even in the case of $CF_3^+$, as the energy is lowered, the etch rates of the silicon oxide film and silicon nitride film are reduced. At an incident energy of 125 eV, transition occurs from the etching to deposition on the silicon nitride film.

Figure 5:
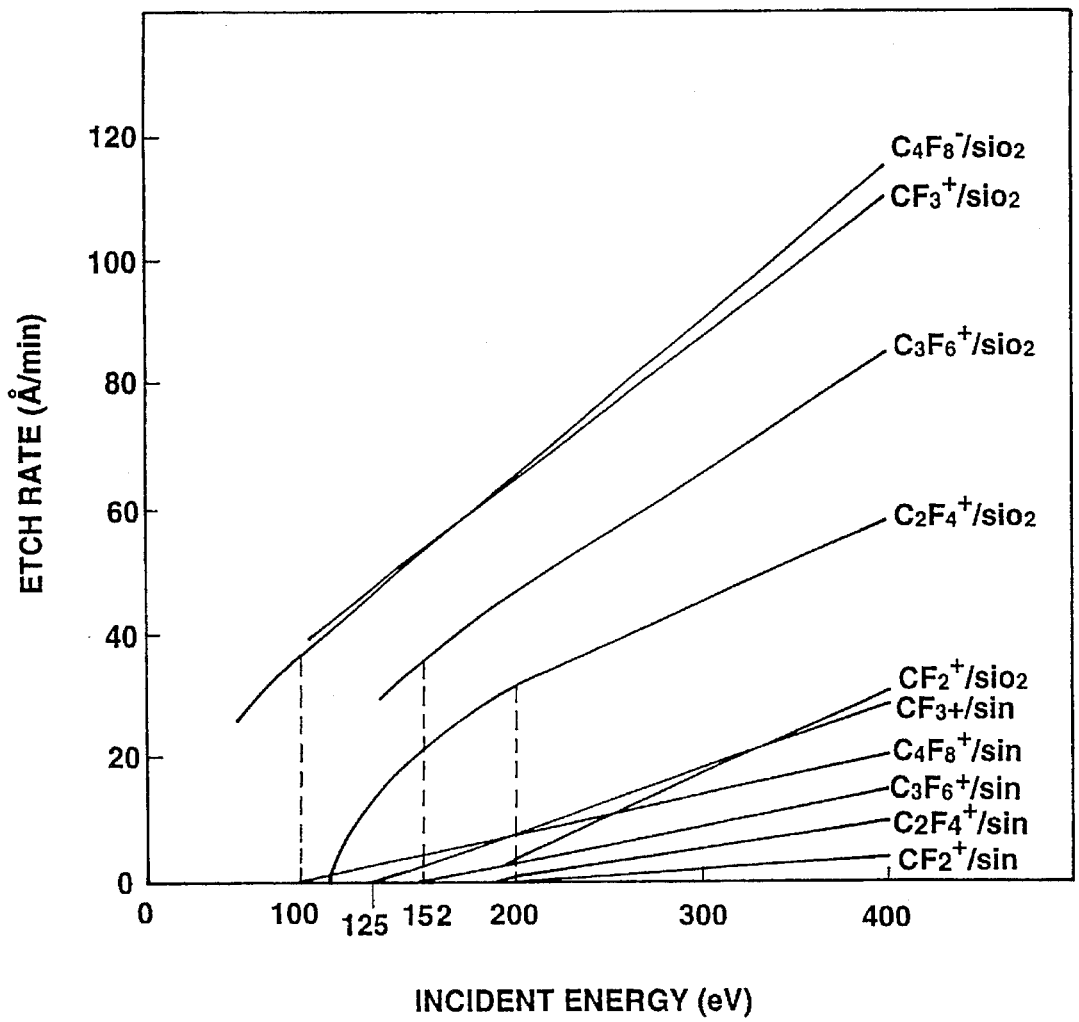
FIG. 5 shows a relationship between incident energy and etch rate with respect to various sorts of ion species.

Incidentally, when attention is directed to $C_2F_4^+$, $CF_2^+$ and $CF_3^+$ ions present in $C_4F_8^+$ gas plasma, it is found from FIG. 5 that incident ion energies providing a selectivity of 20 which is practical in fabricating devices, as mentioned above, are 223 eV, 215 eV and 152 eV, respectively.

Figure 6:
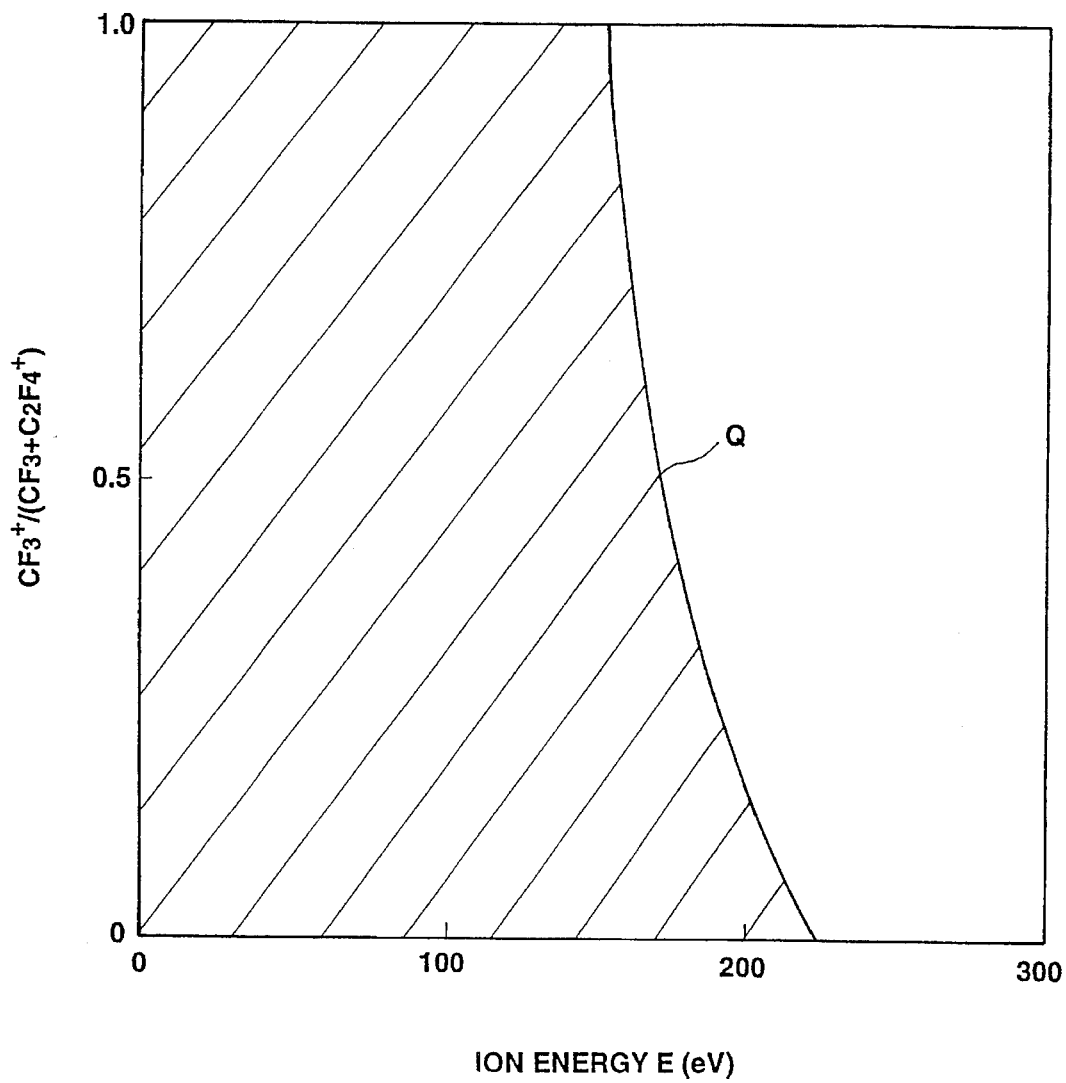
FIG. 6 shows a relationship between incident energy and $CF_3^+/(C_2F_4^+ + CF_3^+)$.

In the range of 152 eV to 223 eV, as seen in FIG. 5, it is only $C_2F_4^+$ and $CF_3^+$ that the etching of the silicon nitride film is large enough to cause a problem. Other ions are negligible. Accordingly, it is appreciated that, in the above range, when only the mixture ratio of these is selected so that the etching selectivity is more than 20, the excellent result can be obtained. FIG. 6 shows a curve Q representing an upper limit of a mixture ratio x to the incident ion energy which is calculated based on the etch rate found in FIG. 5. A zone lower Than the curve Q refers to a safe zone in the range of 152 eV to 223 eV, i.e., in which the etching selectivity can take 20 or more. In other words, in the range of 152 eV to 223 eV, only $C_2F_4^+$ and $CF_3^+$ contribute to the etching. Considering this fact, the relationship between the etch rates of the silicon nitride film and silicon oxide film and the incident energy intensity E is calculated. As a result of the calculation, assuming that 'x' denotes a ratio of $CF_3^+$ to $(C_2F_4^++CF_3^+)$ (i.e., x= $CF_3^+/(C_2F_4^++CF_3^+)$), if the incident energy E directed to the above semiconductor substrate is controlled to satisfy the following equation, an excellent etching selectivity can be obtained.

152 eV<E≦223 eV x<−0.744+ 19768.7/(214.8E −21240)

where x : $CF_3^+/(C_2F_4^++CF_3^+)$

E: ion incident energy

When the incident energy is 152 eV or less, the etch rate is reduced. However, since the etch rate of the silicon nitride film is small, such incident energy may be suitably used as necessary.

Figure 7A:
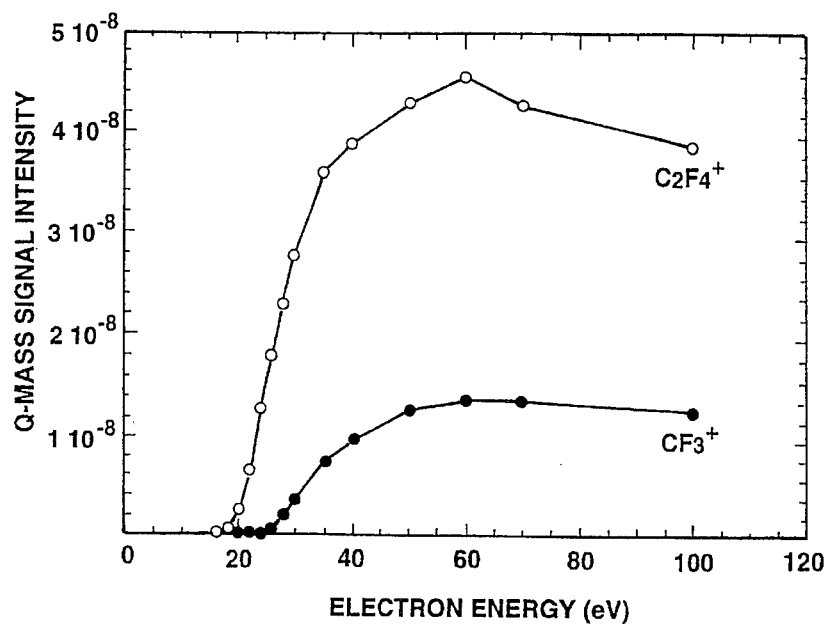
FIGS. 7(a) and 7(b) show an electron energy dependency in dissociation of a $C_4F_8$ gas, respectively.
Figure 7B:
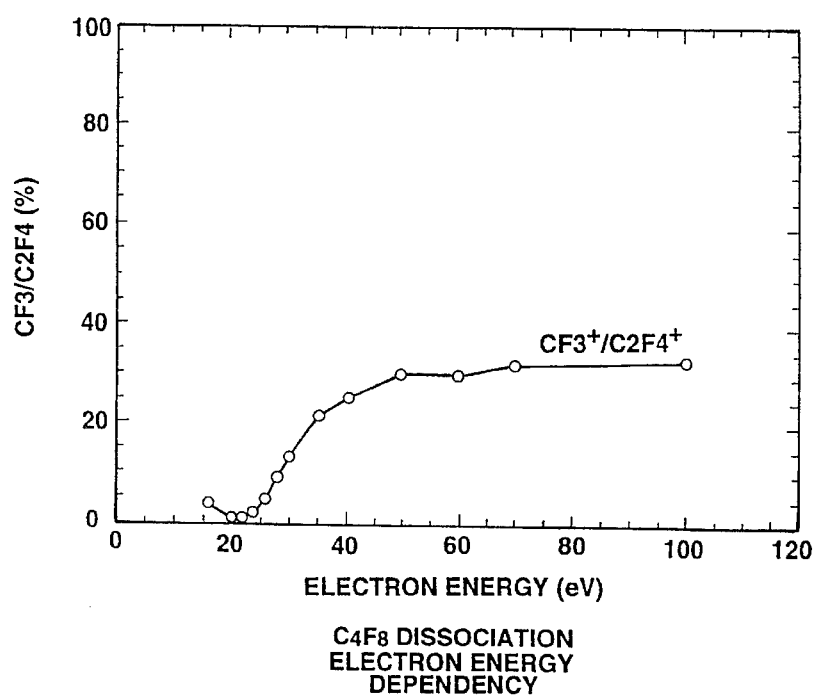

Then, in order to detect an electron energy dependency in the dissociation of a $C_4F_8^+$ gas, electron energy and the numbers of $CF_3^+$ and $C_2F_4^+$ ions generated by the dissociation thereof are measured. The result is given in FIG. 7(a). In the drawing, abscissa denotes electron energy and ordinate denotes mass signal intensity indicative of the above ion numbers. A relationship between an existence probability of $CF_3^+$ ions to $C_2F_4^+$ ions found from FIG. 7(a) and the electron energy is shown in FIG. 7(b). When the incident energy below 200 eV is used and attention is directed to the etching of the silicon nitride film, ions other than the $CF_3^+$ and $C_2F_4^+$ ions are negligible as seen in FIG. 5. Accordingly, it is learned that, in order to obtain an etching selectivity of 20% or less, it is preferable to set a ratio of $CF_3^+$ ions to $C_2F_4^+$ at 20% or less. In this case, it is seen from FIG. 7(b) that when the electron energy is suppressed to 33 eV or less, the ratio of $CF_3^+$ ions to $C_2F_4^+$ can be set at 20% or less.

Figure 8:
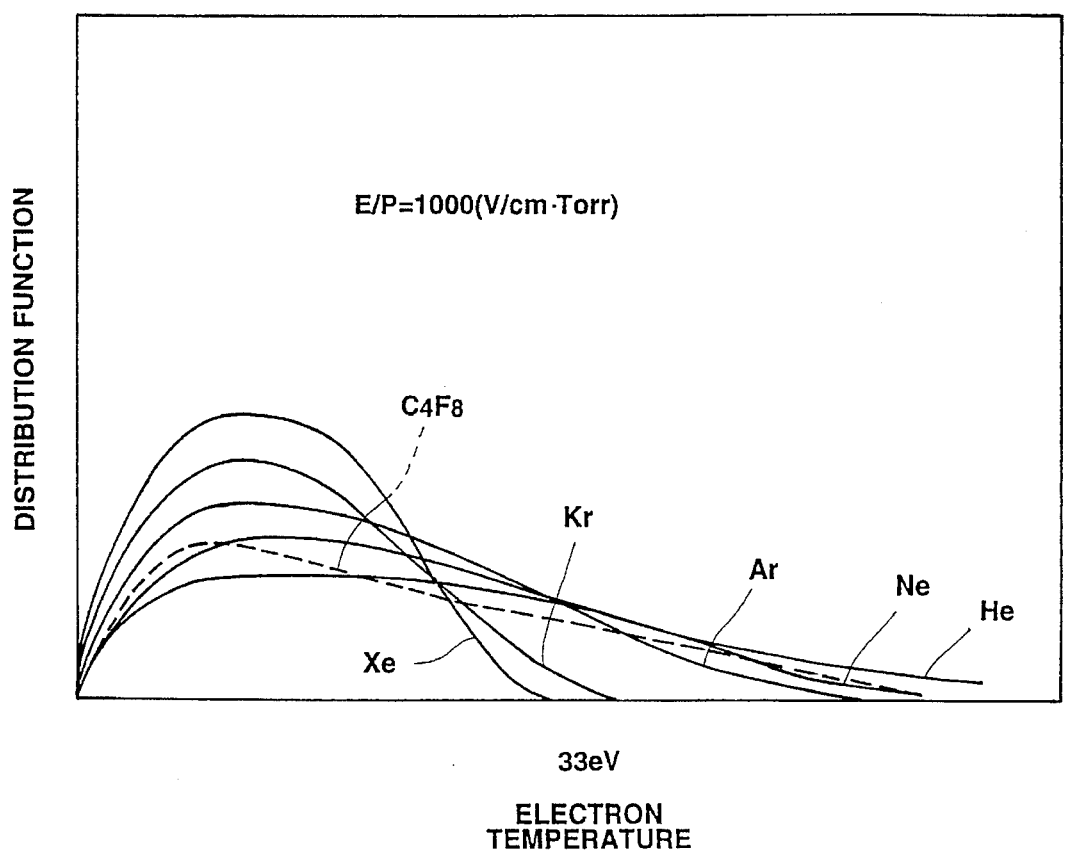
FIG. 8 shows a relationship between electron temperature and distribution function.
Figure 9:
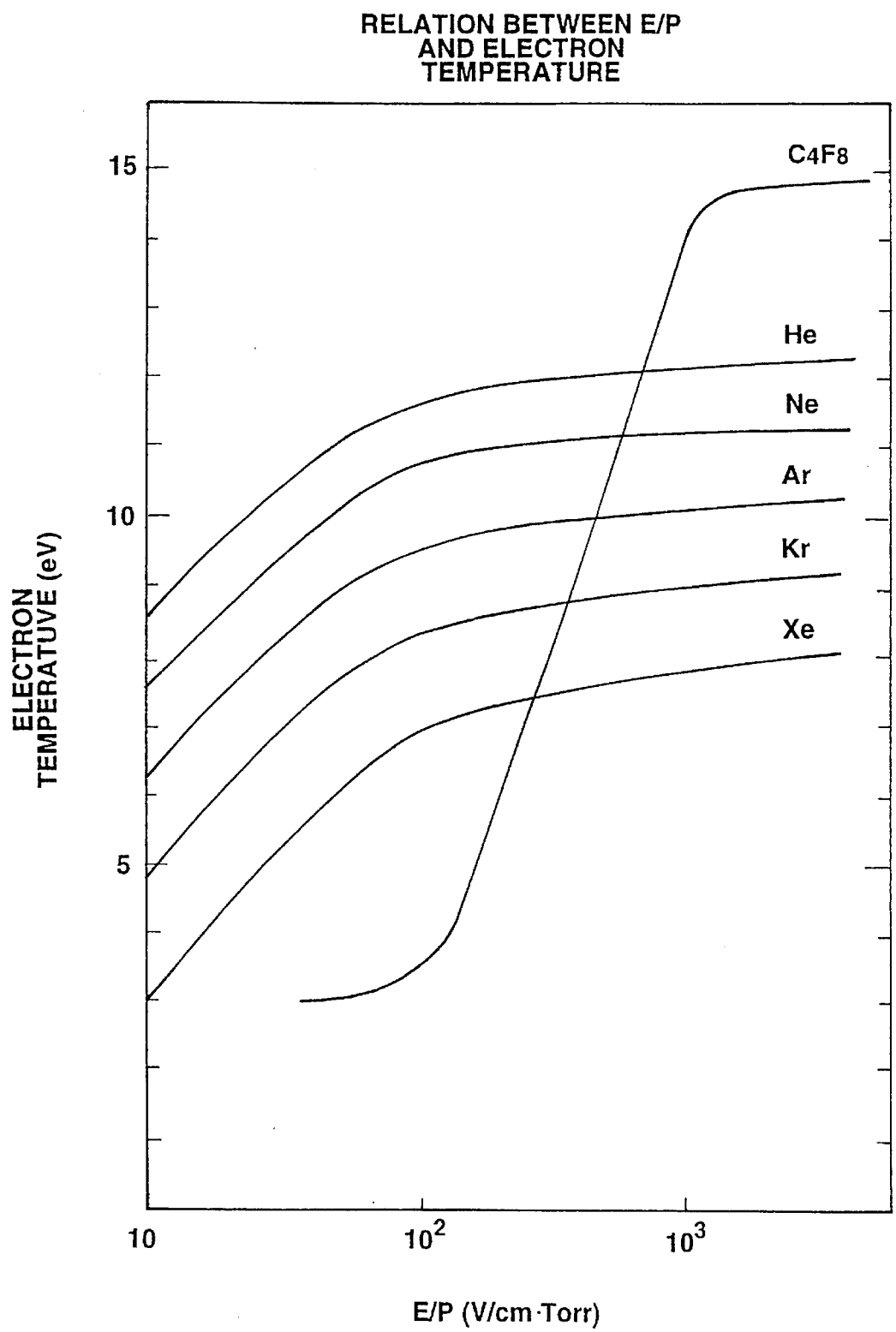
FIG. 9 shows a relationship between electron temperature and E/P.

As shown in the foregoing embodiment, when the kinetic energy of electrons in $C_4F_8^+$ plasma is below 33 eV, a ratio of $C_2F_4^+$ ions generated in the plasma becomes high and thus the $SiO_2/SiN$ selective etching can be realized with a selectivity of 20 or more. However, in magnetron plasma or inductive coupled plasma, E/P (E: electric field intensity, P: pressure within the container) is as great as 100 (V/cm·Torr) or more, for which reason an average electron temperature in the $C_2F_4$ plasma is as large as 15 eV and the percentage of electrons of the energy below 33 eV is small as shown in FIG. 8. In such rare gas plasma as He, Kr or Xe, even when E/P is 100 (V/cm·Torr) or more, the electron temperature is low. Based on such facts, the inventors of the present application have expected that when a mixture gas of the above rare gas and a c-$C_4F_8$ gas is used in a magnetron, the electron temperature in the plasma drops, the percentage of the $C_2F_4$ ions increases, and the selectivity in the $SiO_2/SiN$ selective etching increases, and have conducted experiments. The experiments have showed that only when Kr and Xe gases are used, the $SiO_2/SiN$ selectivity of 20 or more is obtained by mixing the Kr or Xe gas into the c-$C_4F_8$ gas at a suitable mixture ratio. Further, the mixture ratio of rare gas/$C_4F_8$ can be reduced in the order of Kr and Xe and in the case of Xe, a small amount of addition of Xe enables a selectivity of 20 or more, with great effects. This is because, as shown in FIG. 9, the electron temperature of each rare gas in a range of E/P>1000 (V/cm·Torr) is reduced in the order of Kr and Xe, which produces great electron cooling effects in the order of Xe and Kr. Meanwhile, in the case of He, Ne and Ar, their electron temperatures are lower than that of $C_4F_8$ but the percentage of electrons exceeding 33 eV is relatively large in their distribution functions. For this reason, it is considered that sufficient cooling effect cannot be obtained and a high selectivity cannot be obtained. In this way, when Kr or Xe is added, efficient ionization can be realized with a low constant energy suitable for generation of $C_2F_4$.

Figure 10:
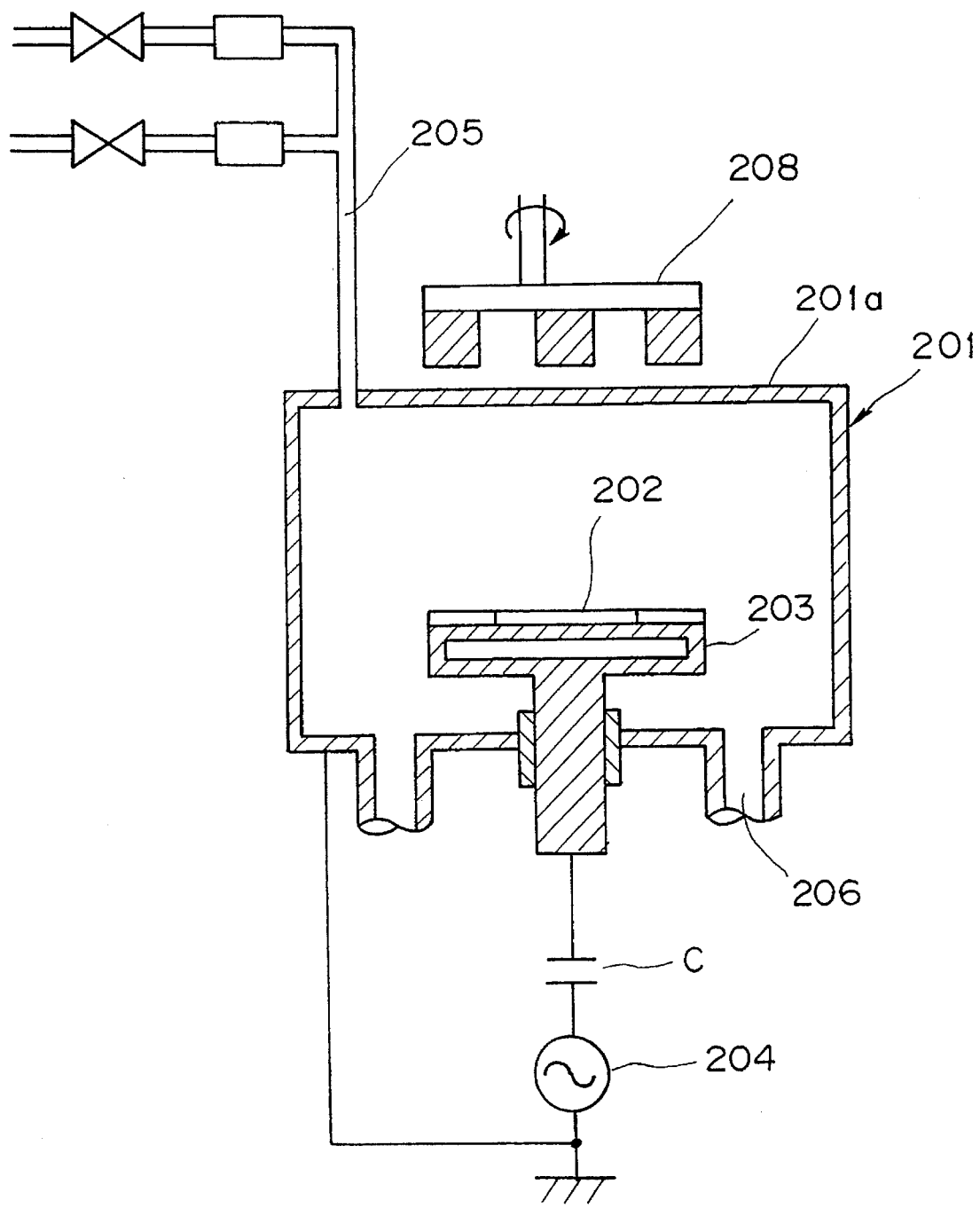
FIG. 10 schematically shows a surface treatment apparatus in accordance with the second embodiment of the present invention.

Embodiment 2:

FIG. 10 schematically shows an arrangement of a surface treatment apparatus used in the method of this embodiment.

The apparatus utilizes magnetron discharging. In the apparatus, an applying power or incident energy to a substrate or a gas pressure, a flow rate and a density are adjusted to control the stay time of c-$C_4F_8$ molecules in the plasma to thereby control a component ratio between chemical species in the plasma. The apparatus comprises a grounded vacuum container 201 which forms a reaction chamber, an upper electrode 201a formed as an upper wall of the vacuum container 201, a lower electrode 203 which is disposed as opposed to the upper electrode 201a within the vacuum container 201, which is provided with a temperature control mechanism including a cooling piping, and which is used as a sample carrying base, an exhaustion system 206 for vacuumizing the interior of the vacuum container 201, and a gas supply source 205. The apparatus performs surface treating operation over a substrate 207 placed on the lower electrode 203. The lower electrode 203 is connected to a high frequency power source 204 via a blocking capacitor C, while the upper electrode 201a is grounded. Applied between these electrodes is a high frequency power of 13.56 Mhz so that a plasma 202 is generated within the vacuum container 201. Also applied onto the lower electrode 203 is a copper plate interposed between polyimide thin films, so that when a voltage of 4 kV is applied from a power source (not shown) to the copper plate, the substrate 207 to be treated is electrostatically attracted onto the lower electrode. Disposed above the upper electrode 201a is a magnetic field generator 208 which is made up of a plurality of permanent magnets and its drive mechanism to apply a magnetic field to a space defined by the opposing lower and upper electrodes 203 and 201a.

c-$C_4F_8^+$ are introduced into the apparatus to generate a plasma therein. The flow rate and pressure of the gas and the applying power are adjusted in the following manner so as to perform etching.

The etching conditions are electron density $n_e$=3E10 cm$^{-3}$, reaction container volume V=2.7 liters, $C_4F_8$ gas flow rate Q=4.5 Torr·liter/sec, process pressure P=40 mTorr, N =$n_3$× P × V × Q$^{-1}$=7.2E8 (=7.2×10$^8$), where En denotes ×10$^n$. When electron density $n_e$=1E9 cm$^{-3}$, an etching selectivity of 20 is obtained. As a result of analyzing the then ion species by using a mass spectrometer, $CF_3^+$, $CF_2^+$ and $C_2F_4^+$ ions are detected and a ratio $CF_3^+/(CF_3^++C_2F_4^+)$ is 6%.

Only the flow rate Q is changed while the other conditions remain unchanged. That is, when the flow rate Q is set to be larger, a sufficient selectivity can be obtained. On the other hand, when the flow rate Q is set to be smaller, a sufficient selectivity cannot be obtained. This is considered to be due to the fact that a stay time is increased and thus $CF_3^+$ ions are increased. Further, when the pressure is increased or the container volume is increased, a selectivity is reduced.

The present invention is not limited to the above $C_4F_8$ gas but such a gas having a large 'n' in $(CF_2)_n^+$ as a $C_5F_{10}$ gas may be introduced into the apparatus to generate a plasma therein. In the latter case, the gas flow rate and pressure, application power and magnetic field intensity are adjusted to generate such a plasma that contains $(CF_2)n^+$ having a specific 'n' as its major component. And when a biasing potential to be applied to the substrate is adjusted to control the incident ion energy, the etching of the silicon oxide film against the silicon nitride film can be carried out with a very excellent selectivity.

Figure 11:
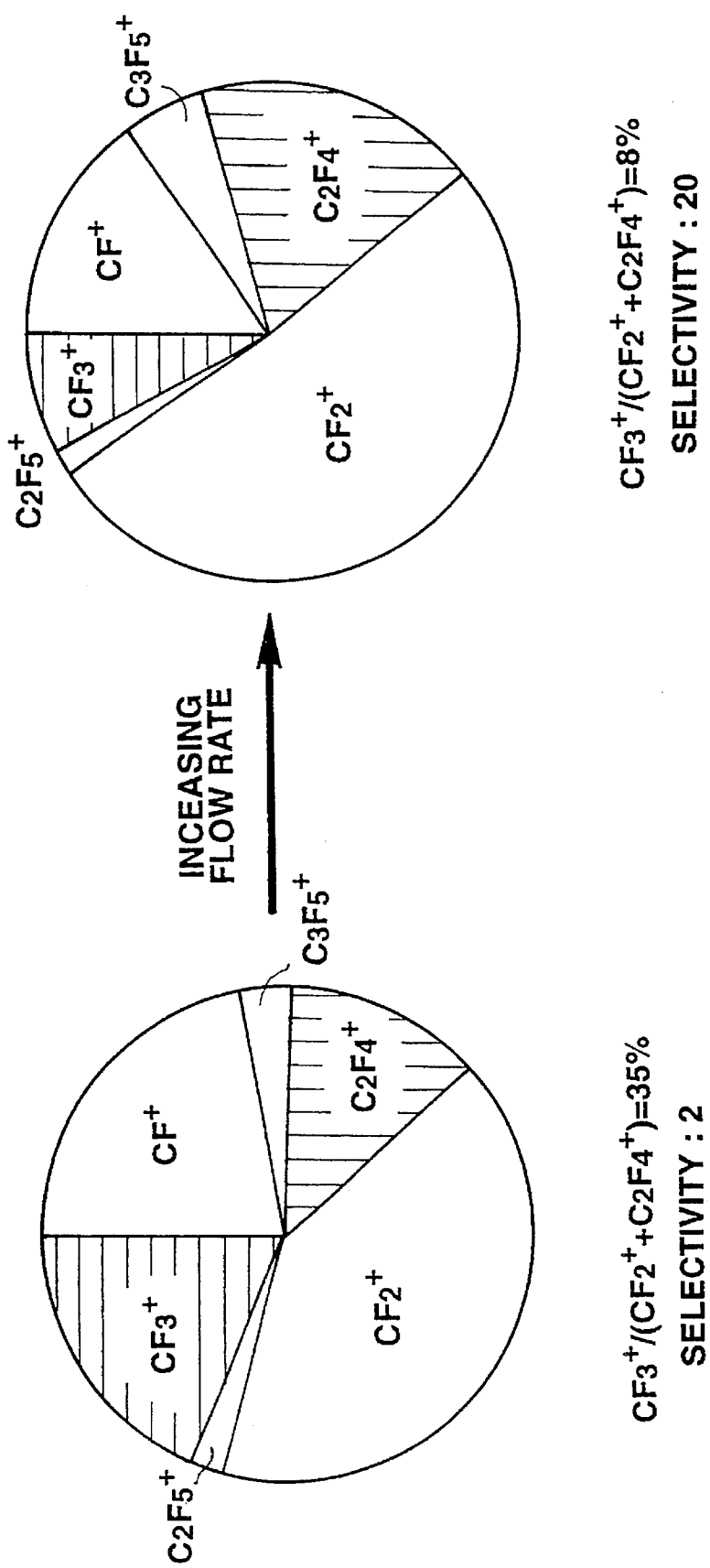
FIG. 11 shows diagrams for explaining flow rate and generated ion species in dissociation of the $C_4F_8$ gas.

Next, ion species in the magnetron plasma generated by dissociation of the $C_4F_8$ gas are analyzed and the result of the analysis is shown in FIG. 11. FIG. 11(b) shows an example in which the flow rate is set to be larger than the case of FIG. 11(a). FIG. 11(a) shows an example in which a ratio $CF_3^+/(CF_2^++C_2F_4^+)$ is 35% and the etching selectivity of the silicon oxide film against the silicon nitride film is 2. FIG. 11(b) shows an example in which the gas flow rate is set to be larger than that of FIG. 11(a) and the ratio $CF_3^+/(CF_2^++ C_2F_4^+)$ is reduced to 8% and the etching selectivity is increased to 20.

Figure 12:
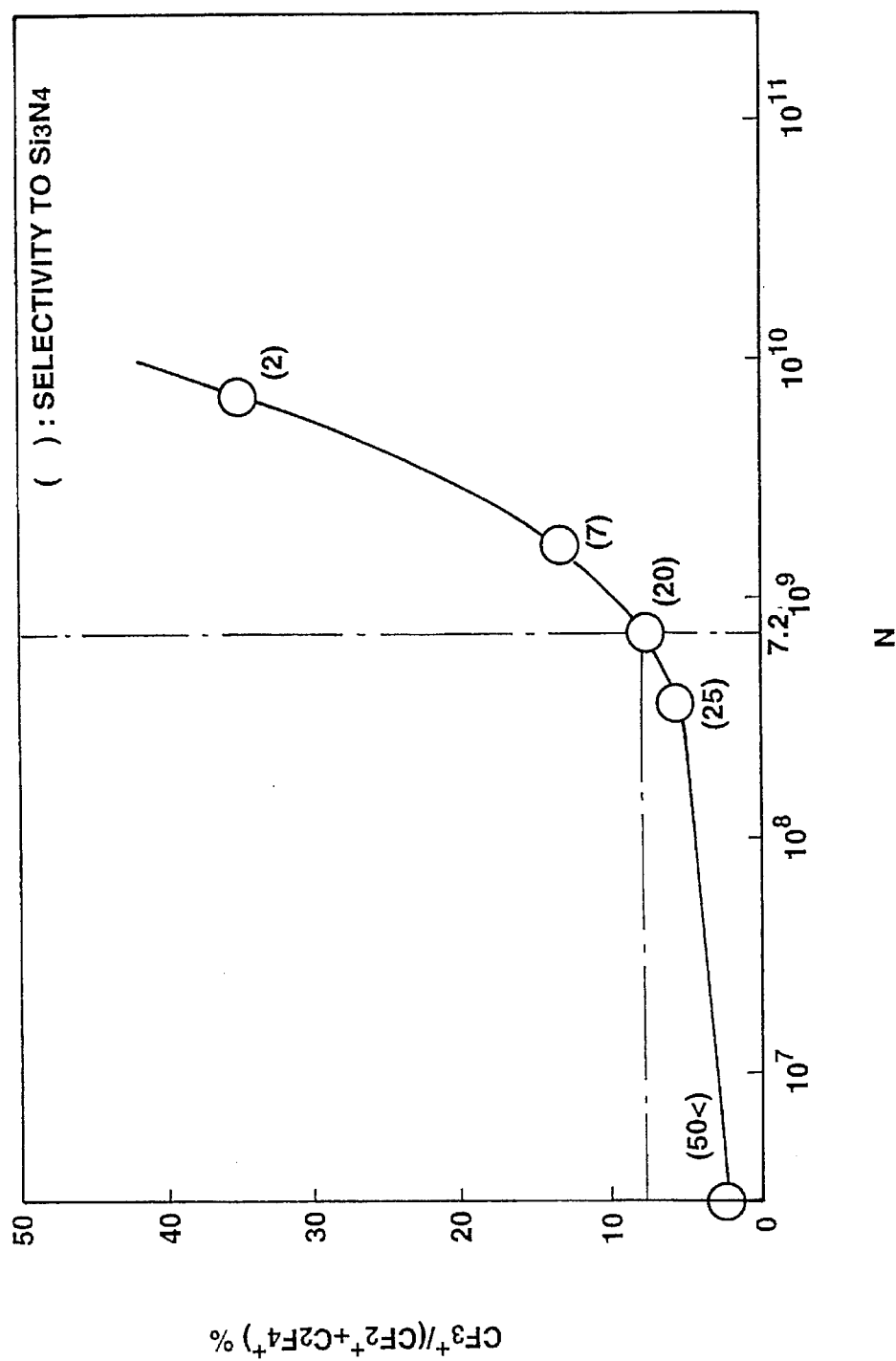
FIG. 12 shows a relationship between mixture ratio of a $CF_3^+$ gas and collision coefficient.

A relationship of the collision coefficient N to the ratio $CF_3^+/(CF_2^++C_2F_4^+)$ is measured and the result of the measurement is given in FIG. 12. In the drawing, ordinate denotes the ratio $CF_3^+/(CF_2^++C_2F_4^+)$ and abscissa denotes the collision coefficient N expressed by the following equation.

$$N=n_e \times P \times V \times Q^{-1}$$

where $n_e$ is electron density in plasma, P process pressure, V the volume of a reactor container, Q c-$C_4F_8$ flow rate. When N is set to be 7.2E8 or less, the ratio $CF_3^+/(CF_2^++C_4F_8^+)$ is 8% or less and the selectivity is 20 or more.

As a result, it is learned that it is preferable that N is 7.2E8 or less.

Figure 13:
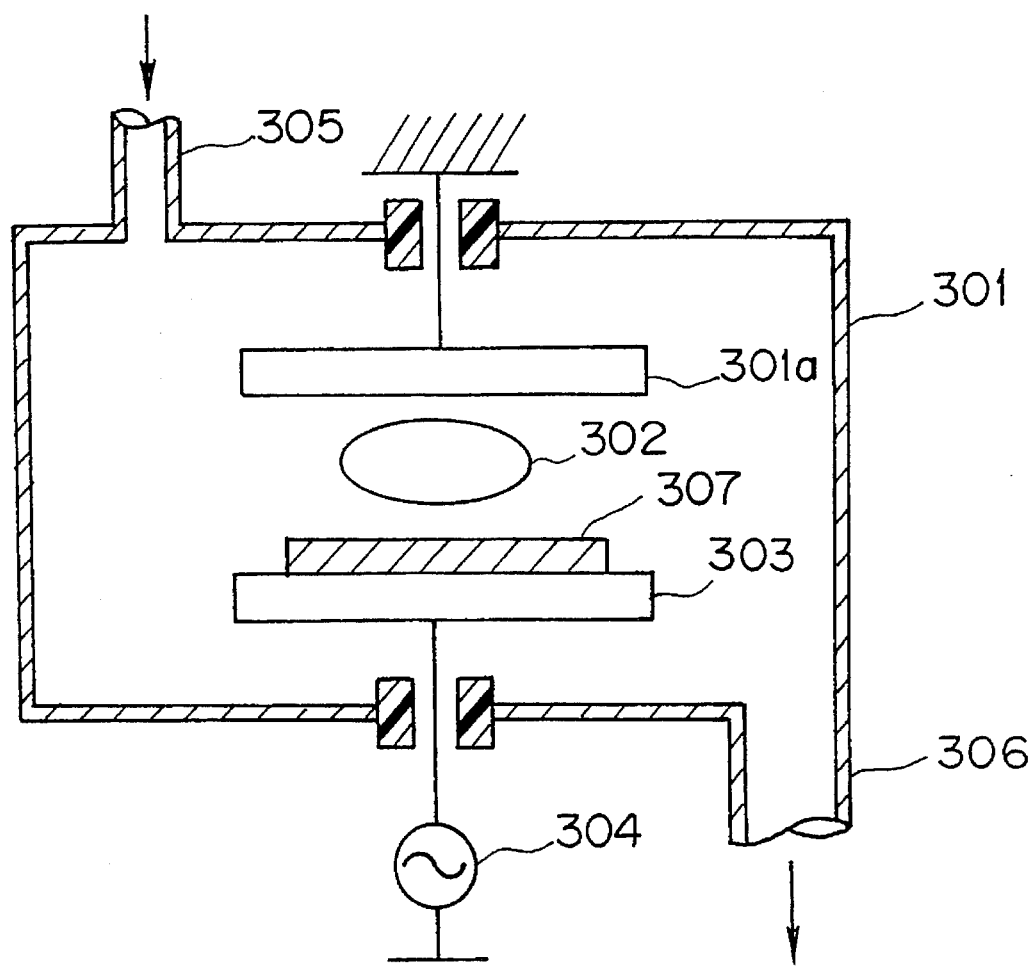
FIG. 13 schematically shows a surface treatment apparatus in accordance with the third embodiment of the present invention.

Embodiment 3:

FIG. 13 is a schematic arrangement of a parallel plate type surface treatment apparatus used in a method in accordance with a third embodiment of the present invention.

The apparatus, which comprises a parallel plate type plasma generation apparatus, utilizes discharging between electrodes and an applying power or gas pressure is adjusted to control a component ratio between chemical species in a plasma. The apparatus comprises a vacuum container 301 forming part of reactor chamber, an upper electrode 301a installed within the vacuum container 301, a lower electrode 303 which is installed as opposed to the upper electrode 301a within the vacuum container 301, which is provided with a temperature control mechanism including a cooling piping and which is used also as a sample carrying base, an exhaustion system 306 for vaccumizing the interior of the vacuum container 301, and a gas supply system 305. The apparatus performs surface treating operation over a substrate 307 placed on the lower electrode 303. The lower electrode 303 is connected to a high frequency power source 304 through a matching circuit (not shown), while the upper electrode 301a is grounded. Applied between these electrodes is a high frequency power of 13.56 Mhz to generate a plasma 302 within the vacuum container 301.

A c-$C_4F_8^+$ gas is introduced into the apparatus to generate the plasma. And a gas flow rate, a pressure and an applying power are adjusted in the following manner and then etching is carried out.

When reactor container volume V=2 liters, $C_4F_8$ gas flow rate Q=2 Torr·liter/sec, process pressure P=1 torr, N=$n_e$ x P x V x Q$^{-1}$=1E9, an etching selectivity of 20 is obtained. As a result of analyzing ion species by using a mass spectrometer, a ratio $CF_3^+/(CF_2^++C_4F_8^+)$ is 8% or less. Even in this case, the flow rate Q is changed while the other conditions remain unchanged. That is, when the flow rate Q is set to be smaller, a sufficient selectivity can be obtained, whereas, when the flow rate Q is set to be smaller, a sufficient selectivity can be obtained. This is considered to be due to the fact that a stay time c-$C_4F_8$ is increased and thus $CF_3^+$ ions are increased. Further, when the pressure is increased or the container volume is increased, the selectivity is reduced.

Although the above description has been made in connection with the parallel plate apparatus based on the magnetron discharging in the present embodiment, such another plasma treatment system as a system based on electron cyclotron resonance (ECR) or a helicon type reactive ion etching (RIE) system using helicon wave may be employed.

Figure 14:
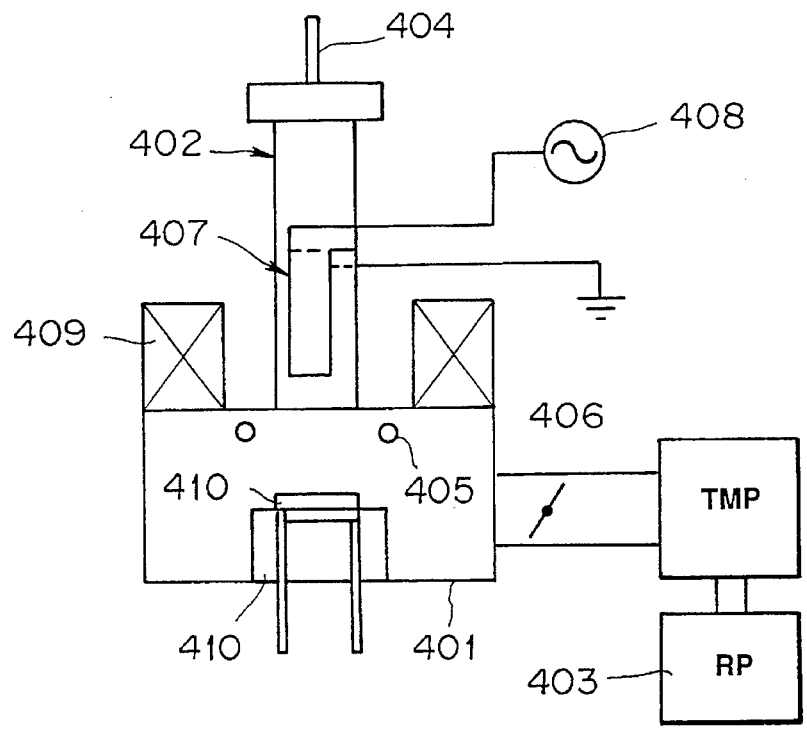
FIG. 14 schematically shows a surface treatment apparatus in accordance with the fourth embodiment of the present invention.
Figure 15:
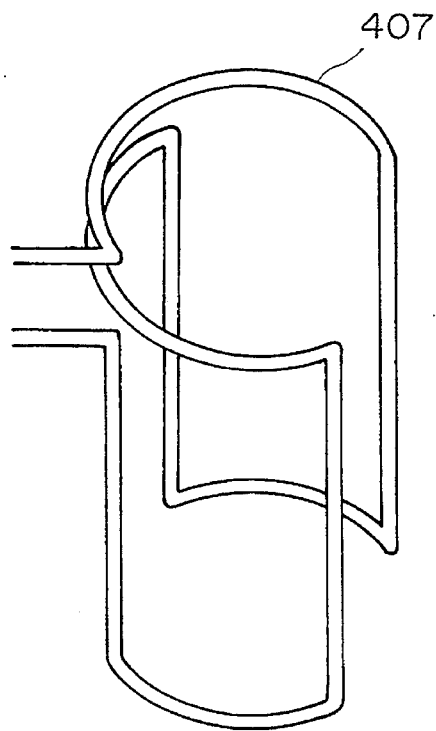
FIG. 15 shows a major part of the same apparatus.
Figure 16:
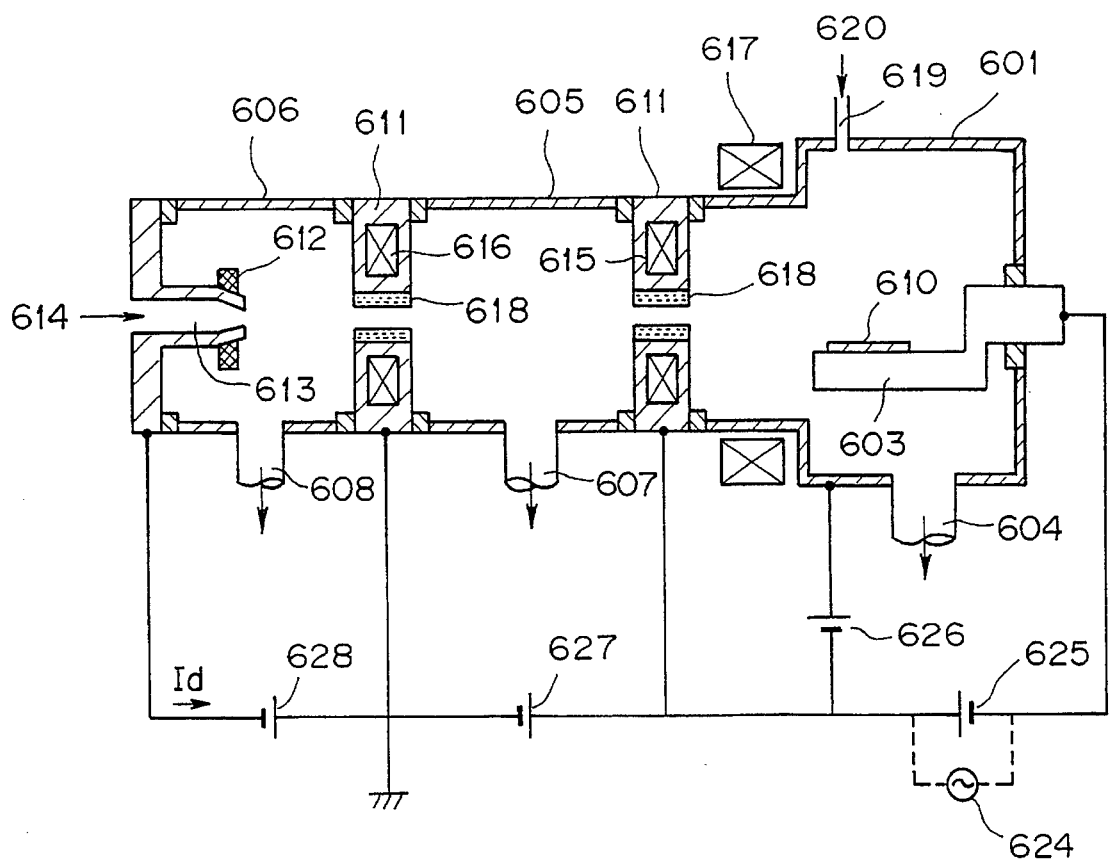
FIG. 16 schematically shows a surface treatment apparatus in accordance with the fifth embodiment of the present invention.

Description will now be made as to a case where, for example, a helicon type RIE system is employed. The system, as shown in FIGS. 14 and 15, comprises a quartz discharge lamp 402 and a vacuum pump 403 mounted within a reaction chamber 401. Disposed within the quartz discharge lamp 402 is a double loop type discharging antenna 407 one end of which is connected to a high frequency power source 408 and the other end of which is grounded. Also disposed within the quartz discharge lamp 402 is an electromagnetic coil 409 for generating a uniform magnetic field of 400 gausses within the quartz discharge lamp 402, which coil is arranged so that, as the electromagnetic coil 409 goes away from the electromagnetic coil 409, a magnetic field intensity becomes small within the reaction chamber 401. Reference numeral 406 denotes a valve and numeral 410 denotes a substrate carrying plate.

When the system is operated under conditions that electron density $n_e$=1E13 cm$^{-3}$, reaction container volume V= 2.4 liters, $C_4F_8$ gas flow rate Q=0.88 Torr·liter/sec, process pressure P=1.7 mtorr and N=$n_e$ x P x V x $Q^{-1}$, an etching selectivity of 20 is obtained. As N is made further smaller, the etching selectivity is improved. When ion species are analyzed by using a mass spectrometer, a ratio $CF_3^+/(CF_2^+ +C_4F_8^+)$ is 8% or less. Even in this case, only the flow rate Q is changed while the other conditions remain unchanged. That is, when the flow rate Q is large, a sufficient selectivity can be obtained, whereas, when the flow rate Q is small, a sufficient selectivity cannot be obtained. This is considered to be due to the fact that a stay time increased and $CF_3^+$ ions increased. Further, when the pressure is increased or the container volume is increased, the selectivity is reduced.

Figure 18:
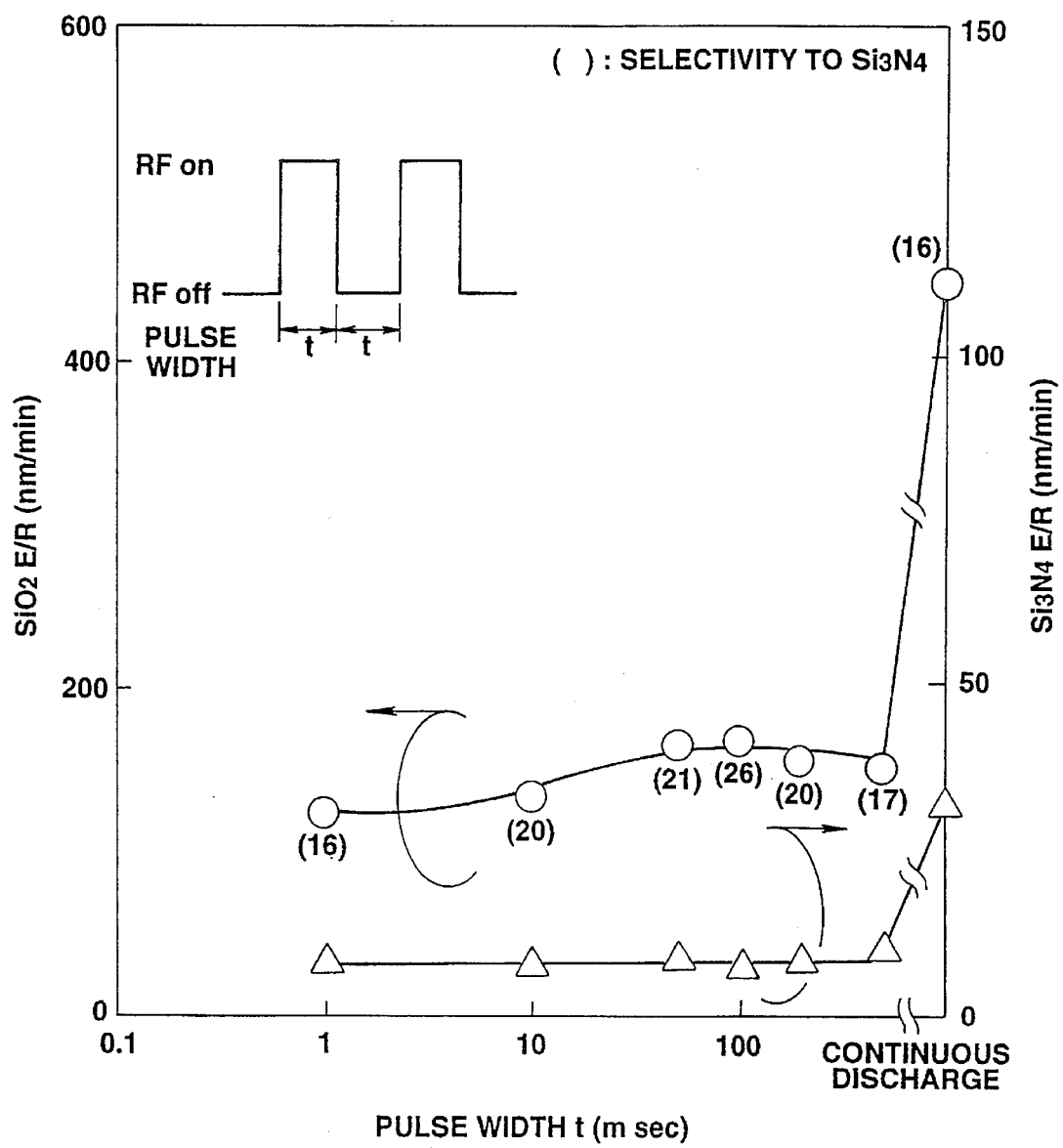
FIG. 18 shows a relationship between pulse width and etching selectivity.

Description will further be made as to a case where such an electron beam excitation type RIE system (EBEP) as shown in FIG. 18 is used. The system comprises a discharging chamber 606 for performing discharging operation, and an excitation chamber 605 for exciting electrons generated by the discharging and for sending excited electrons to a reaction chamber 601. In the reaction chamber, a reactive gas introduced thereinto from a gas inlet port 620 is dissociated by the excited electrons and then guided onto a substrate 610 to be treated to perform suitable etching. The discharging chamber 606 is provided at its rear end with an electrode 616, and a discharging gas 614 is introduced into the discharging chamber 606 via a gas inlet port 613. Reference numerals 612, 616 and 614 denote electrodes, respectively.

When the above system is operated under conditions that electron density $n_e$=1E11 cm$^{-3}$, reaction container volume = 35 liters, $C_4F_8$ gas flow rate =0.25 Torr·liter/sec and process pressure =0.5 mtorr, N is $n_e$ x P x V x $Q^{-1}$=7E9.

In this case, an etching selectivity of 20 is obtained. When N is further set to be smaller, the etching selectivity is improved. At this time, as a result of analyzing ion species by using a mass spectrometer, a ratio $CF_3^+/(CF_2^+ + C_4F_8^+)$ is 8% or less.

Figure 17:
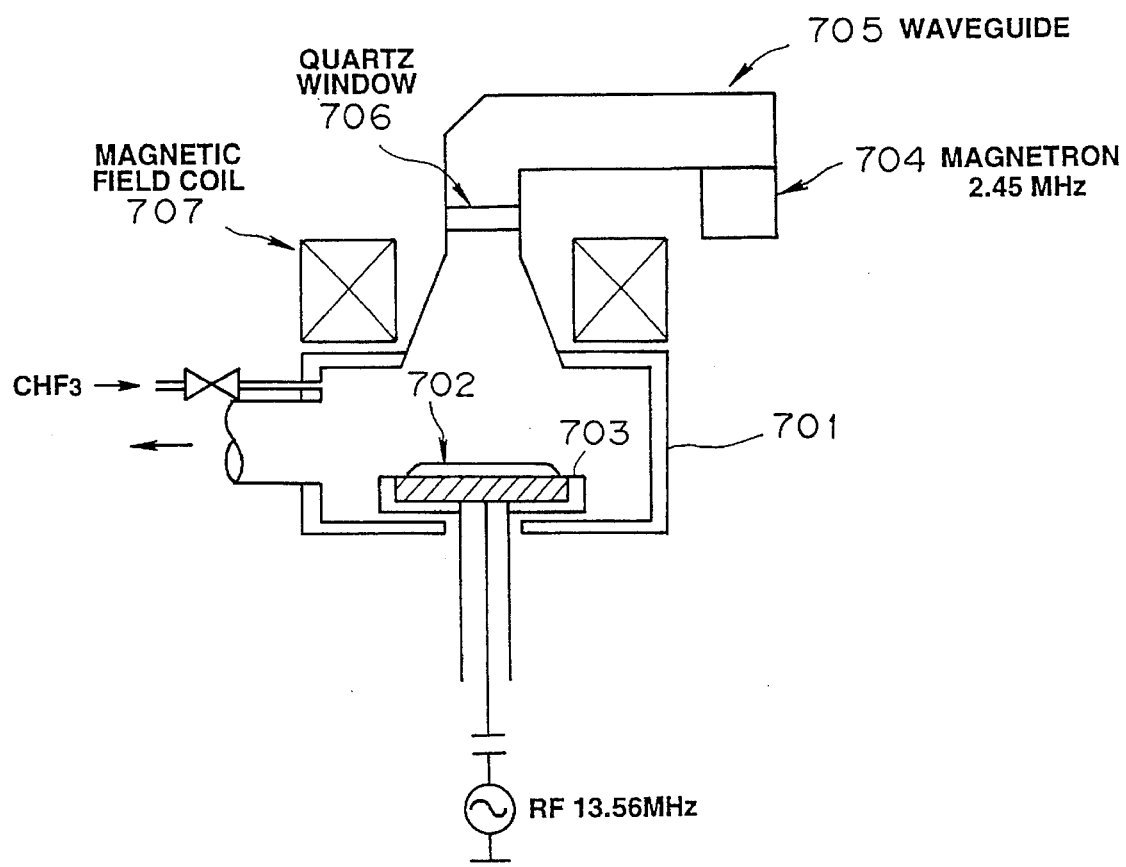
FIG. 17 schematically shows a surface treatment apparatus in accordance with the sixth embodiment of the present invention.

Description will now be made as to a case where a μ-wave plasma etching system (ECR) such as shown in FIG. 17 is employed. In this system, a microwave of 2.45 GHz generated by a magnetron 704 is guided into a reaction container 701 applied with a magnetic field by a magnetic field coil 707 via a waveguide 705 and a quartz window 706 so that a reactive gas is subjected to an ECR discharging excitation. A RF power of 13.56 Mhz is applied to a sample table 703 to control ion radiation energy on a wafer 702 placed on the sample table. When this system is operated under conditions that electron density $n_e$=1E11 cm$^{-3}$, reaction container volume=25 liters, $C_4F_8$ gas flow rate =0.38 Torr·liter/sec, and process pressure =0.5 mtorr, N is $n_e$ x P x V x $Q^{-1}$= 3.3E9 and an etching selectivity of the silicon oxide film to the silicon nitride film is 20. When N is set to be further smaller, the etching selectivity is improved. As a result of analyzing ion species by using a mass spectrometer, the ratio $CF_3^+/(CF_2^++C_4F_8^+)$ is 8% or less.

When an inductive coupled RIE system is operated under such conditions that electron density $n_e$=1E12 cm$^{-3}$, reaction container volume V =7 liters, $C_4F_8$ gas flow rate Q= 0.5 Torr·liter/sec and process pressure P=3 mtorr, N is $n_e$ x P x V x $Q^{-1}$=4.2E10 and an etching selectivity of 20 is obtained. When N is set to be further smaller, the etching selectivity is improved. From the result of analyzing ion species by using a mass spectrometer, it is found that a ratio $CF_3^+/(CF_2^++C_4F_8^+)$ is 8% or less.

FIG. 18 shows a result of measuring the variations in the etch rates of the silicon oxide film and silicon nitride film when pulse modulation is effected with the magnetron plasma. As seen in FIG. 18, the selectivity is increased from 14 to 22 with the pulse modulation of 100 msec.

Figure 19:
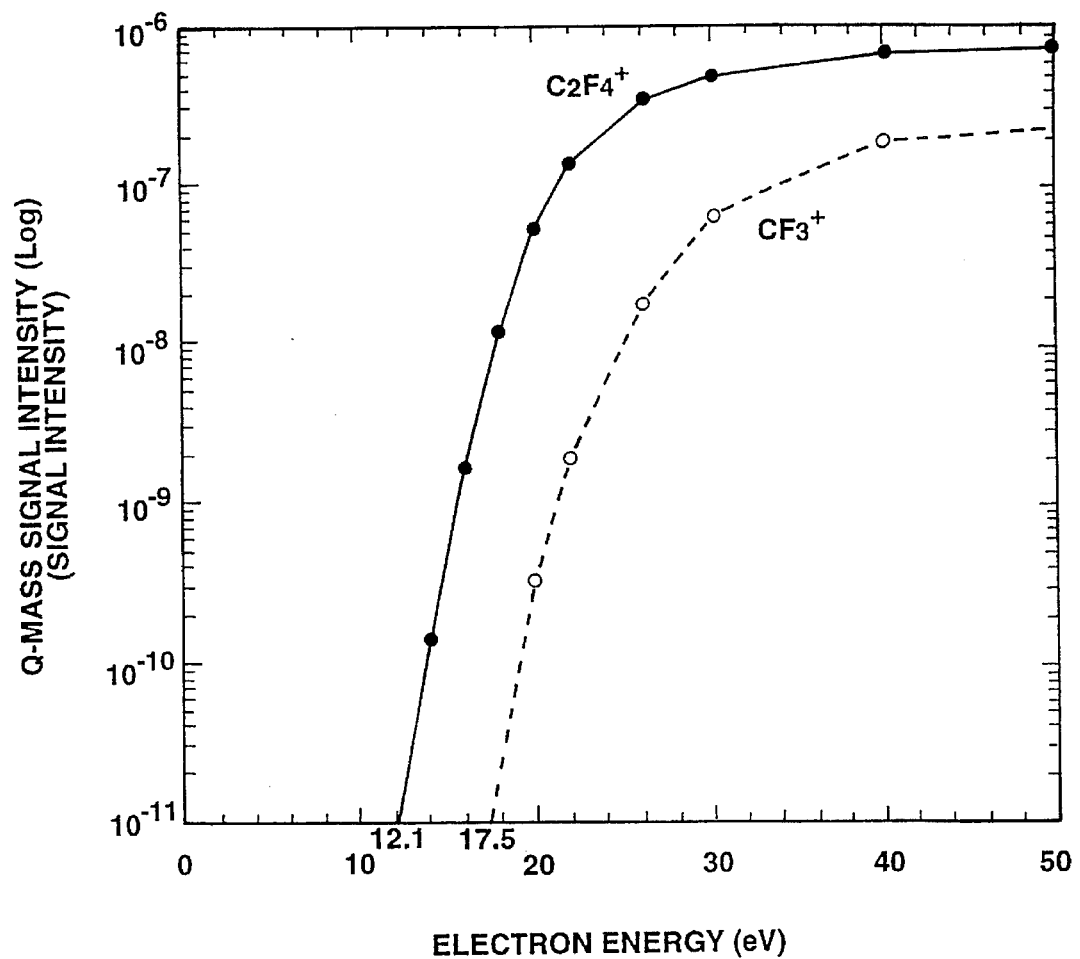
FIG. 19 shows a relationship between electron energy and the numbers of existing $CF_3^+$ and $C_2F_4^+$.
Figure 20:
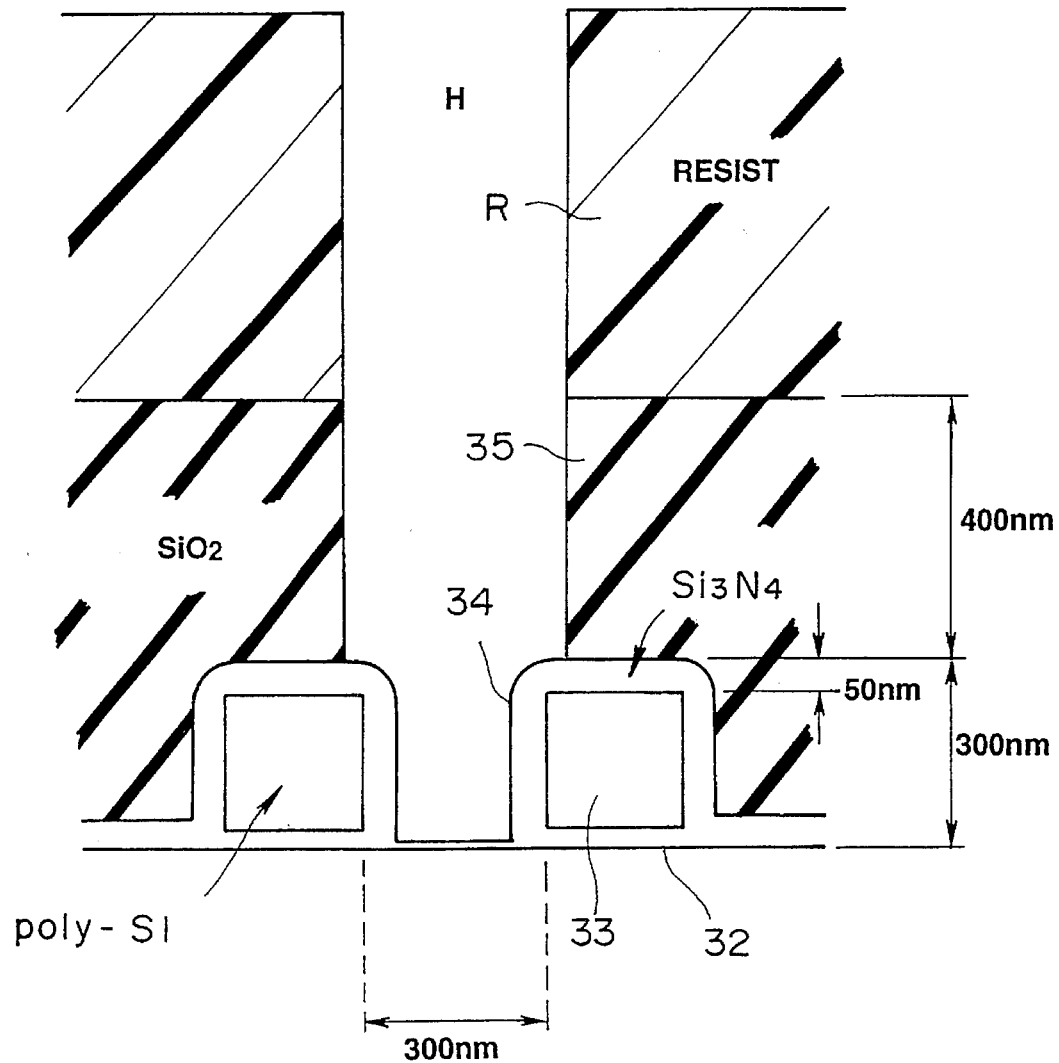
FIG. 20 shows an example of a selective etching.

When a plasma is generated based on photo excitation, a relationship between electron energy and the numbers of $CF_3^+$ and $C_2F_4^+$ ions with respect to different excitation wavelengths is measured. FIG. 19 shows the result of the measurement. It is appreciated from the result that $CF_3^+$ ions do not exist in a excitation wavelength zone of 70.9 to 102.5 nm, i.e., in an electron energy zone of 12.1 to 17.5. Accordingly, an excellent etching selectivity can be obtained.

In accordance with the present invention, since the etching selectivity of not only the silicon oxide film but also such a silicon oxide film containing impurities as BPSG or ASSG to the silicon nitride film can be obtained under substantially the same conditions, the present invention is effective, in particular, for a silicon oxide film containing impurities and easy to be etched.

What is claimed is:

1. A surface treatment method for performing treating operation over a surface of a semiconductor substrate by using a fluorocarbon gas, comprising:

a gas supply step of supplying a gas containing a fluorocarbon gas; and an etching step of generating ions by exciting the fluorocarbon gas, controlling an ion having $(CF_2)_n^+$ (n=1, 2, 3, ... ) as a major component among the generated ions so as to be guided onto the semiconductor substrate, and selectively etching a silicon oxide film against a silicon nitride film.

2. A surface treatment method as set forth in claim 1, wherein the etching step includes a step of controlling an energy incident to the semiconductor substrate such that the energy has an energy value capable of causing reaction induced on the silicon nitride film by the ion having $(CF_2)_n^+$ as the major component to be shifted from etching to deposition.

3. A surface treatment method as set forth in claim 1, wherein the etching step includes a step of controlling the energy incident to the semiconductor substrate such as to satisfy the following relationships where x (=$CF_3^+/(C_2F_4^+ + CF_3^+)$) is ratio of a $CF_3^+$ concentration to a $(C_2F_4^++CF_3^+)$ concentration in the ions obtained by the ion dissociation and E is an incident energy directed to the semiconductor substrate, whereby the ions are guided onto the semiconductor substrate and selective etching is performed to the silicon oxide film against the silicon nitride film.

152 eV<E≦223 eV, and x<−0,744+19768.7/(214.8E −21240)

where x : $CF_3^+/(C_2F_4^++CF_3^+)$

E: ion incident energy.

4. A surface treatment method as set forth in claim 1, wherein the etching step includes a step of selectively etching a silicon oxide film against a silicon nitride film by controlling the ions such that energy incident to the semiconductor substrate is 152 eV or less, and by guiding the ions onto the semiconductor substrate.

5. A surface treatment method as set forth in claim 3, wherein the etching step is a step of controlling an ion beam such as to satisfy the relationships and guiding the ion beam onto the semiconductor substrate.

6. A surface treatment method as set forth in claim 4, wherein the etching step is a step of controlling an ion beam such as to satisfy the relationships and guiding the ion beam onto the semiconductor substrate.

7. A surface treatment method as set forth in claim 1, wherein the gas supply step includes a step of supplying a c-$C_4F_8^+$ gas as the fluorocarbon gas, and the ions are generated by changing the c-$C_4F_8$ gas into plasma.

8. A surface treatment method as set forth in claim 1, wherein the gas supply step includes a step of supplying a c-$C_4F_8$ gas as the fluorocarbon gas under a reduced pressure into an air-tight reaction container which accommodates the semiconductor substrate, and the etching step is a step of selectively etching a silicon oxide film against a silicon nitride film by changing a c-$C_4F_8$ gas into plasma to generate ions, controlling the generated ions such that a ratio of $CF_3^+$ ion concentration to a total concentration of $(CF_2)_n^+$ in the ions to be guided onto the semiconductor substrate becomes 8% or less, and by guiding the controlled ions onto the semiconductor substrate.

9. A surface treatment method as set forth in claim 1, wherein the gas supply step includes a step of supplying a c-$C_4F_8$ gas and at least one of Kr and Xe gases under a reduced pressure into an air-tight reaction container for accommodating the semiconductor substrate, and the ion dissociation is carried out by generating a plasma from a mixture gas of the c-$C_4F_8$ gas and at least one of the Kr and Xe gases.

10. A surface treatment method as set forth in claim 1, wherein the gas supply step includes a step of supplying a c-$C_4F_8$ gas under a reduced pressure into an air-tight reaction container which accommodates the semiconductor substrate, and the ion dissociation is carried out by exciting the gas by using an electron beam which is controlled so that an electron energy is less than 33 eV so as to generate plasma.

11. A surface treatment method as set forth in claim 1, wherein the gas supply step includes a step of supplying a c-$C_4F_8$ gas under a reduced pressure into an air-tight reaction container which accommodates the semiconductor substrate, and the ion is generated by generating a plasma from the gas with use of light having wavelengths of between 70.9 nm and 102.5 nm.

12. A surface treatment method as set forth in claim 1, wherein the gas supply step includes a step of supplying a c-$C_4F_8$ gas under a reduced pressure into an air-tight reaction container which accommodates the semiconductor substrate, and the ion dissociation is carried out by changing the gas into plasma, and by controlling the following relation in which collision coefficient N represents collision between c-$C_4F_8$ molecules present in the plasma and electrons present in the plasma, $n_e$ represents an electron density in the plasma, $\tau$ represents a stay time of the c-$C_4F_8$ molecules in the plasma within the air-tight reaction container.

$N=n_e \times \tau \leq 7.2E8$
$\tau = P \times V \times Q^{-1}$
P: c-$C_4F_8$ partial pressure
V: volume of the reaction container
Q : c-$C_4F_8$ flow rate.

13. A surface treatment method as set forth in claim 1, wherein the etching step includes a step of controlling such that an incident energy of ions to the semiconductor substrate generated by changing the gas into plasma becomes 500 eV or less.

14. A surface treatment method as set forth in claim 12, wherein the ions are generated by generating magnetron plasma while controlling such that the stay time $\tau = P \times V/Q$ of the c-$C_4F_8$ molecules present in the plasma becomes 24 msec or less.

15. A surface treatment method as set forth in claim 12, wherein the ions are generated by generating plasma by using a parallel plate plasma generation apparatus while controlling such that the stay time $\tau = P \times V/Q$ of the c-$C_4F_8$ molecules present in the plasma becomes 720 msec or less.

16. A surface treatment method as set forth in claim 12, wherein the ions are generated by exciting the gas by a controlled electron beam while controlling such that the stay time $\tau = P \times V/Q$ of the c-$C_4F_8$ molecules present in plasma becomes 7.2 msec or less.

17. A surface treatment method as set forth in claim 12, wherein the ion dissociation is achieved by generating plasma by using a microwave-excited plasma generation apparatus while controlling such that the stay time $\tau = P \times V/Q$ of the c-$C_4F_8$ molecules present in the plasma becomes 7.2 msec or less.

18. A surface treatment method as set forth in claim 12, wherein the ion dissociation is achieved by generating plasma by using an inductive coupled plasma generation apparatus while controlling such that the stay time $\tau = P \times V/Q$ of the c-$C_4F_8$ molecules present in the plasma becomes 0.72 msec or less.

19. A surface treatment method as set forth in claim 12, wherein the ion dissociation is achieved by generating plasma by using a helicon-excited plasma generation apparatus while controlling such that the stay time $\tau = P \times V/Q$ of the c-$C_4F_8$ molecules present in the plasma becomes 0.072 msec or less.

20. A surface treatment method as set forth in claim 3, wherein the gas supply step includes a step of supplying a c-$C_4F_8$ gas under a reduced pressure into an air-tight reaction container which accommodates the semiconductor substrate, and the ions are generated by changing the gas into plasma by using an high-frequency pulse signal modulated with pulses of several milliseconds to several hundreds of milliseconds.

21. A surface treatment method as set forth in claim 4, wherein the gas supply step includes a step of supplying a c-$C_4F_8$ gas under a reduced pressure into an air-tight reaction container which accommodates the semiconductor substrate, and the ions are generated by changing the gas into plasma by using an high-frequency pulse signal modulated with pulses of several milliseconds to several hundreds of milliseconds.

22. A surface treatment method as set forth in claim 20, wherein the plasma of the gas is generated by a magnetron excited plasma generation apparatus.

23. A surface treatment method as set forth in claim 1, wherein the gas supply step includes a step of supplying a c-$C_4F_8$ gas under a reduced pressure into an air-tight reaction container which accommodates the semiconductor substrate, and the ions are generated by changing the gas into plasma by using an electron beam modulated with pulses of several milliseconds to several tens of milliseconds.

24. A surface treatment apparatus comprising:
gas supply means for supplying a fluorocarbon gas onto a semiconductor substrate disposed within a reaction container;
gas exhaustion means for exhausting gas within the reaction container; and
ion species control means for changing the fluorocarbon gas into plasma and controlling such as to guide an ion having $(CF_2)_n^+$ as a major component among the obtained ions onto the semiconductor substrate.

25. A surface treatment apparatus as set forth in claim 24, further comprising means for controlling at least one of the gas supply means and the gas exhaustion means so as to control the c-$C_4F_8$ flow rate Q or the c-$C_4F_8$ partial pressure such that a collision coefficient N indicative of collision between $c-C_4F_8$ molecules present in the plasma and electrons present in the plasma, $n_e$ indicative of an electron density in the plasma and $\tau$ indicative of a stay time of the $c-C_4F_8$ molecules in the plasma within the air-tight reaction container satisfy the following relationship.

$N = n_e \times \tau \leqq 7.2E8$ where $\tau = P \times V \times Q^{-1}$

P: $c-C_4F_8$ partial pressure

V: volume of the reaction container

Q: $c-C_4F_8$ flow rate

26. A surface treatment apparatus as set forth in claim 24, wherein the ion species control means includes means for changing the gas into plasma by using an electron beam modulated with pulses of several milliseconds to several tens of milliseconds.

* * * * *